(12) United States Patent
Pant et al.

(10) Patent No.: US 10,401,941 B2
(45) Date of Patent: Sep. 3, 2019

(54) CLOCK GLITCH PREVENTION FOR RETENTION OPERATIONAL MODE

(71) Applicant: QUALCOMM Incorporated, San Diego, CA (US)

(72) Inventors: Harshat Pant, San Diego, CA (US); Ramprasath Vilangudipitchai, San Diego, CA (US); Srijith Nair, San Diego, CA (US); Mohammad Tamjidi, San Diego, CA (US)

(73) Assignee: QUALCOMM Incorporated, San Diego, CA (US)

( * ) Notice: Subject to any disclaimer, the term of this patent is extended or adjusted under 35 U.S.C. 154(b) by 278 days.

(21) Appl. No.: 15/425,980

(22) Filed: Feb. 6, 2017

(65) Prior Publication Data

US 2018/0224921 A1 Aug. 9, 2018

(51) Int. Cl.
*G06F 1/32* (2019.01)
*G06F 1/3287* (2019.01)
*G06F 1/3296* (2019.01)
*G06F 1/10* (2006.01)
*H03K 5/13* (2014.01)

(52) U.S. Cl.
CPC .............. *G06F 1/3287* (2013.01); *G06F 1/10* (2013.01); *G06F 1/3296* (2013.01); *H03K 5/13* (2013.01); *Y02D 10/171* (2018.01)

(58) Field of Classification Search
None
See application file for complete search history.

(56) References Cited

U.S. PATENT DOCUMENTS

| 6,166,574 A | 12/2000 | Tao |
| 6,268,749 B1 | 7/2001 | Fisch et al. |
| 6,762,638 B2 | 7/2004 | Correale, Jr. et al. |

(Continued)

FOREIGN PATENT DOCUMENTS

KR  20160143159 A  12/2016

OTHER PUBLICATIONS

Hill, Mark D. Introduction to Computer Engineering pp. 3-5 to 3-6 http://pages.cs.wisc.edu/~markhill/cs252/Fall2013/lectures/lec03_digital_logic.pdf (Year: 2013).*

(Continued)

*Primary Examiner* — Danny Chan
(74) *Attorney, Agent, or Firm* — Colby Nipper/Qualcomm

(57) ABSTRACT

An integrated circuit (IC) is disclosed with clock glitch prevention for a retention operational mode. In an example aspect, the IC includes a clock signal source that generates a source value for a clock signal, which is distributed by a clock tree along a downstream direction. The IC further includes a deviant clock signal generator, a clock signal controller, and a retention storage device. The deviant clock signal generator is disposed along the clock tree downstream from the clock signal source and generates a deviant value for the clock signal. The clock signal controller prevents downstream propagation of the deviant value of the clock signal responsive to a retention signal. The retention storage device is disposed downstream from the clock signal controller. The retention storage device processes data responsive to the clock signal and retains a data value during a power collapse event responsive to the retention signal.

30 Claims, 15 Drawing Sheets

(56) References Cited

U.S. PATENT DOCUMENTS

| | | | |
|---|---|---|---|
| 7,548,103 B2 | 6/2009 | Ramaraju et al. | |
| 7,639,056 B2 | 12/2009 | Gururajarao et al. | |
| 7,948,263 B2 | 5/2011 | Kim et al. | |
| 8,044,695 B2 | 10/2011 | Miyazaki | |
| 8,381,163 B2 | 2/2013 | Schreiber et al. | |
| 8,555,124 B2 | 10/2013 | Idgunji et al. | |
| 8,841,952 B1 | 9/2014 | Singh et al. | |
| 8,854,077 B2 | 10/2014 | Hoberman et al. | |
| 9,112,489 B2 | 8/2015 | Priel et al. | |
| 9,154,142 B2 | 10/2015 | Dobbs et al. | |
| 9,665,160 B1 * | 5/2017 | Cao | G06F 1/324 |
| 2009/0039940 A1 | 2/2009 | Hong et al. | |
| 2014/0266401 A1 | 9/2014 | Park et al. | |

OTHER PUBLICATIONS

Kaushik P.G., et al., "Dynamic Power Reduction of Digital Circuits by Clock Gating", International Journal of Advancements in Technology, Mar. 2013, vol. 4, No. 1, pp. 79-88.

"International Search Report and Written Opinion", PCT Application No. PCT/US2017/064383, dated May 4, 2018, 21 pages.

Partial International Search Report—PCT/US2017/064383—ISA/EPO—dated Mar. 6, 2018.

* cited by examiner

CLOCK GLITCH PREVENTION FOR RETENTION OPERATIONAL MODE

TECHNICAL FIELD

This disclosure relates generally to an integrated circuit (IC) that includes a memory having a retention feature and, more specifically, to preventing a clock glitch in conjunction with a clamping of a retention control signal to enable data in the memory to be reliably maintained during a retention operational mode.

BACKGROUND

Power consumption of electronic devices is an increasingly important factor in electronic device design. From an environmental perspective, energy demands of electronic devices occupy a sizable percentage of total energy usage due to large corporate data centers and the ubiquity of personal computing devices. Environmental concerns therefore motivate efforts to reduce the power consumption of electronic devices to help conserve the earth's resources. From an economic perspective, less power consumption translates to lower energy bills. Furthermore, many personal computing devices are portable and powered by batteries. The less energy that is consumed by a portable battery-powered electronic device, the longer the portable device can operate without recharging the battery. Lower energy consumption also enables the use of a smaller battery and the adoption of a thinner form factor, which means devices can be made more portable or versatile. Thus, the popularity of portable electronic devices also motivates efforts to reduce the power consumption of electronic devices.

An electronic device consumes power if the device is coupled to a power source and is turned on. This is true for the entire electronic device, but it is also true for individual parts of the electronic device. Power consumption can therefore be reduced if parts of an electronic device are decoupled from power or turned off, even while other parts remain powered and turned on. Entire discrete components of an electronic device, such as a whole integrated circuit (IC) or a display screen, may be decoupled from power or turned off. Alternatively, selected parts of a discrete component may likewise be powered down. For example, a distinct processing portion of an integrated circuit chip, such as a processing core, may be selectively powered down for some period of time to reduce energy consumption.

Thus, powering down a portion of an integrated circuit, such as a core, can save power and extend battery life. Powering down an integrated circuit portion is referred to herein as a "power collapse," a "power collapse event," or as creating a "power collapse period." Unfortunately, implementing a power collapse of an integrated circuit core can create problems. For example, resuming a computing task using a core that was powered down takes time, which slows performance and can adversely impact a user experience. Operational data, which is data needed for an ongoing computing task, may also be lost if power is removed from certain types of computer memory. Losing operational data may force an application to restart or permanently damage user files, such as documents or pictures. To avoid a loss of operational data when a core of an integrated circuit is being powered down, the operational data can be stored in one or more special types of memory that maintain data during a power collapse period. In other words, some memory types, such as flash memory, are capable of maintaining stored data when power is removed from the memory. Flash memory, however, is unsuitable for high-speed processing because read/write access times are too slow.

Another type of memory that is capable of maintaining data during a power collapse period is called a retention flip-flop (RFF). Generally, flip-flops may be implemented as retention flip-flops or non-retention flip-flops. A flip-flop (FF), or flop, is a unit of computing memory that stores one bit of operational data. Flip-flops are relatively fast memory units, so integrated circuit designers employ flip-flops frequently across different functional cores of a chip. A typical flip-flop includes a master portion and a slave portion in which data is migrated internally from the master portion to the slave portion. Clocked, or synchronous, flip-flops are configured to enable data migration such that the data stored in the master portion is transferred to the slave portion responsive to a pulse of a clock signal.

Non-retention flip-flops are volatile memory that relinquish stored data if powered down, such as because of a power collapse event occurring with a corresponding core that includes the non-retention flip-flops. Retention flip-flops, on the other hand, are capable of retaining data during a power collapse period. In one approach, a retention flip-flop obtains power from a power rail that does not lose power during a power collapse event, so the retention flip-flop can therefore retain the one bit of operational data. Consequently, such retention flip-flops can support efforts to manage power consumption by facilitating the retention of operational data during a power collapse period without resorting to a slower memory type, such as flash memory.

Unfortunately, employing retention flip-flops is not as straightforward as employing non-retention flip-flops. Operating retention flip-flops is more complicated than operating non-retention flip-flops due to the additional data retention feature. If stored data is to be properly retained before, during, and after a power collapse period, the supplying of power, the positioning of data, and the control signaling for the retention flip-flop have to be carefully orchestrated. Otherwise, data stored in a retention flip-flop is subject to being compromised by a power collapse event, and the ability to use retention flip-flops to achieve power-conserving benefits is jeopardized accordingly.

SUMMARY

An integrated circuit (IC) is disclosed that implements clock glitch prevention circuitry to support a retention operational mode in which stored data is to be retained during a power collapse event. In an example aspect, an integrated circuit includes a clock signal source that generates a source value for a clock signal. A clock tree distributes the clock signal along a downstream direction away from the clock signal source. The integrated circuit further includes a deviant clock signal generator, a clock signal controller, and a retention storage device. The deviant clock signal generator is disposed along the clock tree downstream from the clock signal source and generates a deviant value for the clock signal. The clock signal controller prevents downstream propagation of the deviant value of the clock signal responsive to a retention signal. The retention storage device is disposed downstream from the clock signal controller so as to be capable of retaining a data value during a power collapse event responsive to the retention signal without being adversely affected by the deviant value of the clock signal.

In an example aspect, an integrated circuit is disclosed. The integrated circuit includes a clock signal source that generates a source value for a clock signal and a clock tree that distributes the clock signal from the clock signal source along a downstream direction. The integrated circuit also includes a deviant clock signal generator, a clock signal controller, and a retention storage device. The deviant clock signal generator is disposed along the clock tree downstream from the clock signal source and generates a deviant value for the clock signal. The deviant value is different from the source value. The clock signal controller is disposed downstream from the deviant clock signal generator and prevents downstream propagation of the deviant value of the clock signal responsive to a retention signal. The retention storage device is disposed downstream from the clock signal controller. The retention storage device processes data responsive to the clock signal and retains a data value during a power collapse event responsive to the retention signal.

In an example aspect, an integrated circuit is disclosed. The integrated circuit includes a clock signal source configured to generate a source value for a clock signal and a clock tree configured to distribute the clock signal from the clock signal source along a downstream direction in which the clock signal propagates away from the clock signal source. The integrated circuit also includes deviation means for generating a deviant value for the clock signal, with the deviant value being different from the source value. The deviation means is disposed along the clock tree downstream from the clock signal source. The integrated circuit additionally includes clock control means for preventing downstream propagation of the deviant value of the clock signal responsive to a retention signal, with the clock control means being disposed downstream from the deviation means. The integrated circuit further includes a retention storage device disposed downstream from the clock control means. The retention storage device is configured to process data responsive to the clock signal and to retain a data value during a power collapse event responsive to the retention signal.

In an example aspect, a method for preventing clock glitches for a retention operational mode is disclosed. The method includes propagating a source value for a clock signal downstream along a clock tree. The method also includes generating a deviant value for the clock signal based on the source value, with the deviant value being different from the source value, and propagating the deviant value of the clock signal downstream along the clock tree. The method further includes determining a state of a retention signal. Responsive to a determination that the retention signal is in an inactive state, the method additionally includes passing the deviant value downstream as a controlled clock signal. Alternatively, responsive to a determination that the retention signal is in an active state, the method additionally includes substituting the deviant value with a value that matches the source value of the clock signal in preparation for the retention operational mode and forwarding the value downstream as the controlled clock signal. The method further includes propagating the controlled clock signal downstream towards a retention storage device.

In an example aspect, an integrated circuit is disclosed. The integrated circuit includes clock signal controlling circuitry, control signal managing circuitry, and a retention flip-flop. The clock signal controlling circuitry is configured to receive a clock signal and a retention signal and to output a controlled clock signal. Responsive to the retention signal having an inactive state, the clock signal controlling circuitry outputs the received clock signal as the controlled clock signal. Responsive to the retention signal having an active state, the clock signal controlling circuitry swallows the received clock signal and outputs a retention-capable value as the controlled clock signal. The control signal managing circuitry is coupled to the clock signal controlling circuitry and is configured to receive the controlled clock signal and to output a retention control signal. Responsive to the retention signal having the inactive state, the control signal managing circuitry outputs the controlled clock signal as the retention control signal. Responsive to the retention signal having the active state, the control signal managing circuitry clamps the controlled clock signal and outputs an isolation value as the retention control signal. The retention flip-flop is coupled to the control signal managing circuitry and configured to receive the retention control signal. The retention flip-flop isolates a data value stored in the retention flip-flop to retain the data value during a power collapse event responsive to the isolation value as the retention control signal.

DETAILED DESCRIPTION

Figure 1:
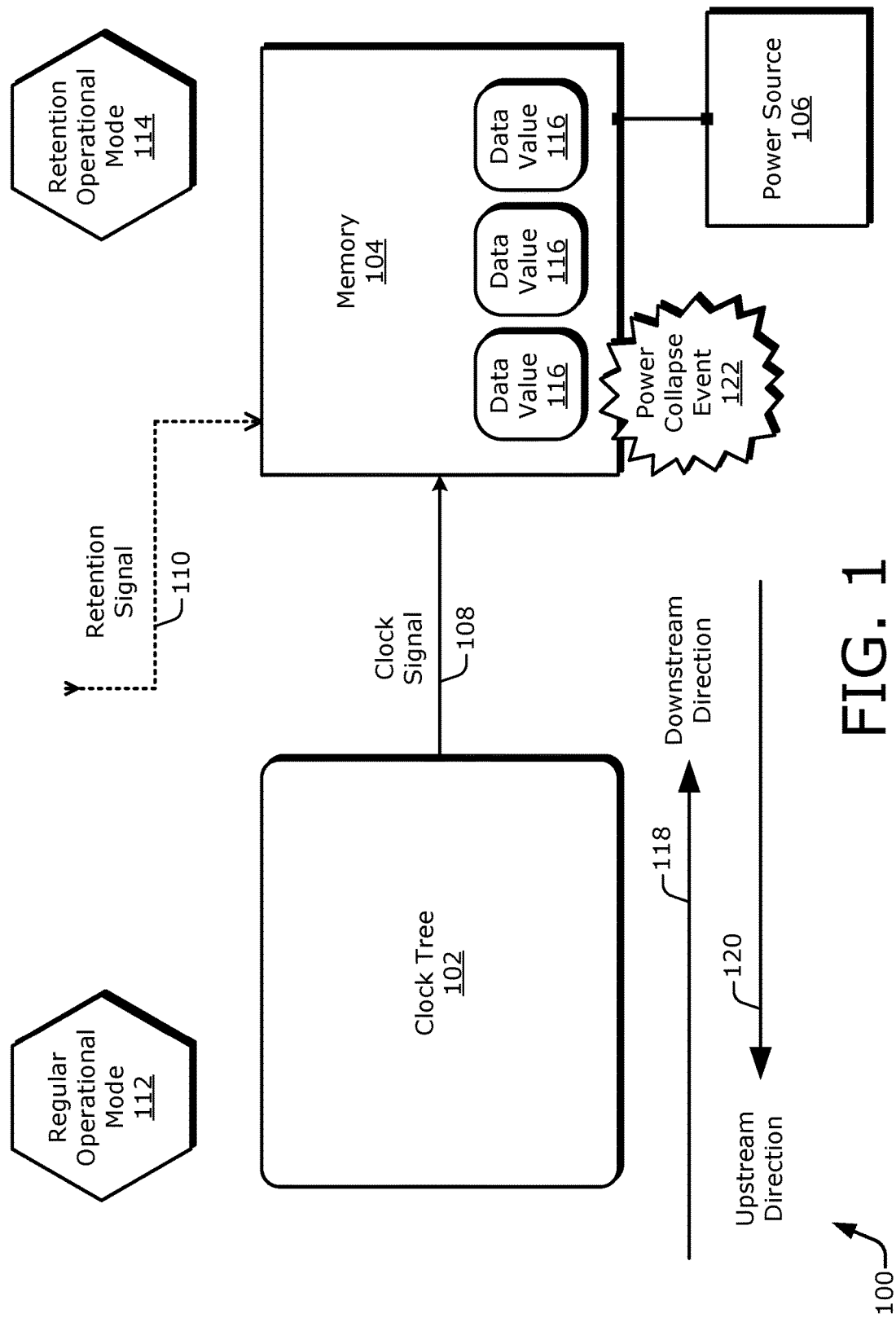
FIG. 1 illustrates an example data retention environment including a clock tree and a memory having a retention feature in which stored data values can survive a power collapse event in accordance with example implementations.

Generally, operating a memory with a retention feature is more complicated than operating one without a retention feature. This is due in part to the interaction between a clock signal and a retention signal. The retention feature of the memory is controlled based on an expectation that the clock signal and the retention signal will both have certain respective values. If either signal deviates from the respective expected value, the retention control falters, and stored data is not reliably maintained during a power collapse period. Some clock trees have one or more circuit devices that can cause the clock signal to take on a deviant value that differs from the expected value of the clock signal. Example implementations that are described herein counteract the deviant value of the clock signal by preventing the deviant value from propagating downstream to circuitry that controls the retention feature of the memory.

In a conventional system, a core can undergo a power collapse by removing power from the core when the core will be unused for some period of time. After the power collapse event, power is restored to the core for further processing. If a new processing task is to be initiated after the power collapse event, power can be entirely removed from the data portions (e.g., the non-control portions) of the core. On the other hand, if the same processing task is to be continued after the power collapse event, the data information as well as the control information for the processing task is maintained during the power collapse.

To maintain over a power collapse event the data information and the control information for a processing task in a core, a memory having a retention feature is implemented as one or more retention storage devices in the core. As used herein below, the term "data" refers to data information or control information. The retention storage devices are capable of retaining data during a power collapsible event in which power is removed from a collapsible power rail that supplies power to the core. However, managing retention storage devices so as to maintain the reliability of the stored data before, during, and after the power collapse event involves careful implementation of clock control circuitry.

An example of a retention storage device is a retention flip-flop (RFF). A flip-flop typically includes a master portion and a slave portion that together store one bit of data. To transform a standard, non-retention flip-flop into a retention flip-flop, the retention flip-flop is designed so that the one bit of data survives a power down time period. In addition to powering a portion of the retention flip-flop with a non-collapsible or constant power rail, the survival of the single bit of data in the retention flip-flop is accomplished by carefully controlling operation of the retention flip-flop based on both a clock signal and a retention signal, along with any set or reset signal that may be coupled to the retention flip-flop. The retention signal indicates when a regular operational mode is ending and a retention operational mode is starting, and vice versa. The retention operational mode corresponds to when a power collapse event is to occur.

To properly control a retention flip-flop and ensure that desired data is maintained during a power collapse event, the clock signal and the retention signal, as well as any set/reset signal, are designed to be at known, expected values. A clock source is gated and held at some architected value, typically a low voltage level, for the retention operational mode. However, if the clock signal that arrives at the retention flip-flop does not still have the intended architected value, the desired data is lost in at least some circumstances. Thus, if the clock signal that is provided to the retention flip-flop presents an unexpected value, data cannot be reliably maintained during the retention operational mode.

In operation, a clock tree distributes the clock signal from the clock signal source over an integrated circuit chip using clock tree logic disposed along the clock tree. The clock tree logic includes a number of different circuit devices. Unfortunately, some clock tree logic includes circuit devices that alter the value of the clock signal, such as an exclusive-or (XOR) gate or an odd number of inverters. These types of circuit devices are referred to herein as "deviant clock signal generators." Deviant clock signal generators cause the value of the clock signal to deviate from the architected value of the clock signal that is expected to be routed to the retention flip-flop during a retention operational mode.

To address this lack of data retention reliability caused by an unexpected or unpredictable value of a clock signal, systems and techniques that are described herein control the value of the clock signal that is supplied to retention flip-flops or other kinds of retention storage devices. The controlled clock signal has a value that enables the retention storage devices to be properly managed so as to enable stored data to be retained during a retention operational mode. The stored data can therefore survive a power collapse event.

In one or more described implementations, an integrated circuit includes a clock signal source and a clock tree. The clock signal source generates a source value for a clock signal. The clock tree distributes the clock signal from the clock signal source along a downstream direction in which the clock signal propagates away from the clock signal source. The integrated circuit also includes a deviant clock signal generator, a clock signal controller, and multiple retention storage devices. The deviant clock signal generator is disposed along the clock tree downstream from the clock signal source. The deviant clock signal generator generates a deviant value for the clock signal, with the deviant value differing from the source value. The clock signal controller is disposed downstream from the deviant clock signal generator. The clock signal controller prevents downstream propagation of the deviant value of the clock signal responsive to a retention signal. The multiple retention storage devices are disposed downstream from the clock signal controller. The retention storage devices process data responsive to the clock signal and retain data values during a power collapse event responsive to the retention signal.

In other described implementations, the integrated circuit further includes a control signal manager disposed downstream from the clock signal controller. The control signal manager receives the clock signal via the clock signal controller. The control signal manager produces a retention control signal based on the clock signal received via the clock signal controller and responsive to the retention signal. The control signal manager also provides the retention control signal to the multiple retention storage devices. The retention storage devices receive the retention control signal from the control signal manager and perform memory functions based on the retention control signal.

In these manners, an expected value of a clock signal is provided to retention circuitry for a retention storage device.

The expected value can correspond to the source value of the clock signal as output by a clock signal source to prepare for a power collapse event. Based on controlling the provided clock signal to have the expected value of the clock signal, data values stored in a retention storage device can be reliably maintained during the power collapse event. Consequently, retention storage devices can be employed to conserve power in electronic devices having integrated circuits.

FIG. 1 illustrates an example data retention environment including a clock tree 102 and a memory 104 having a retention feature in which stored data values 116 can survive a power collapse event 122 in accordance with example implementations. An integrated circuit 100 includes the clock tree 102, the memory 104, and a power source 106. The power source 106 can be implemented as one or more power rails, a power management integrated circuit (PMIC), some combination thereof, and so forth. As shown, the power source 106 supplies power to the memory 104, but the power source 106 can also supply power to the clock tree 102 or other portions of the integrated circuit 100.

The clock tree 102 propagates the clock signal 108 along a downstream direction 118 away from a clock source (not shown in FIG. 1) and opposite to an upstream direction 120. The clock tree 102 provides a clock signal 108 to the memory 104. The memory 104 performs operations, such as read or write, based on the clock signal 108. Based on a retention signal 110, the memory 104 also implements a retention feature such that stored data values 116 survive a power collapse event 122. For visual clarity, the retention signal 110 is depicted with a small-dashed line in the figures.

The integrated circuit 100 is capable of operating in at least two different power modes: a regular operational mode 112 and a retention operational mode 114. In the regular operational mode 112, the integrated circuit 100 executes instructions and stores data using circuitry that is powered at one or more non-zero voltage levels. In the retention operational mode 114, the integrated circuit 100 operates in a powered down mode. The power that is supplied to the memory 104 is at least reduced for the retention operational mode 114 as part of the power collapse event 122.

In example implementations for the power collapse event 122, the retention signal 110 is asserted into an active state to indicate that the retention operational mode 114 is in effect or power reduction is imminent. The power source 106 powers down at least parts of the memory 104 by lowering or removing a supply voltage to conserve power. However, the memory 104 retains the data values 116 before, during, and after the power collapse event 122 as described herein. Generally, the memory 104 is operated based on the clock signal 108 and in response to the retention signal 110 for the regular operational mode 112 or the retention operational mode 114 as described further with reference to FIG. 2.

Figure 2:
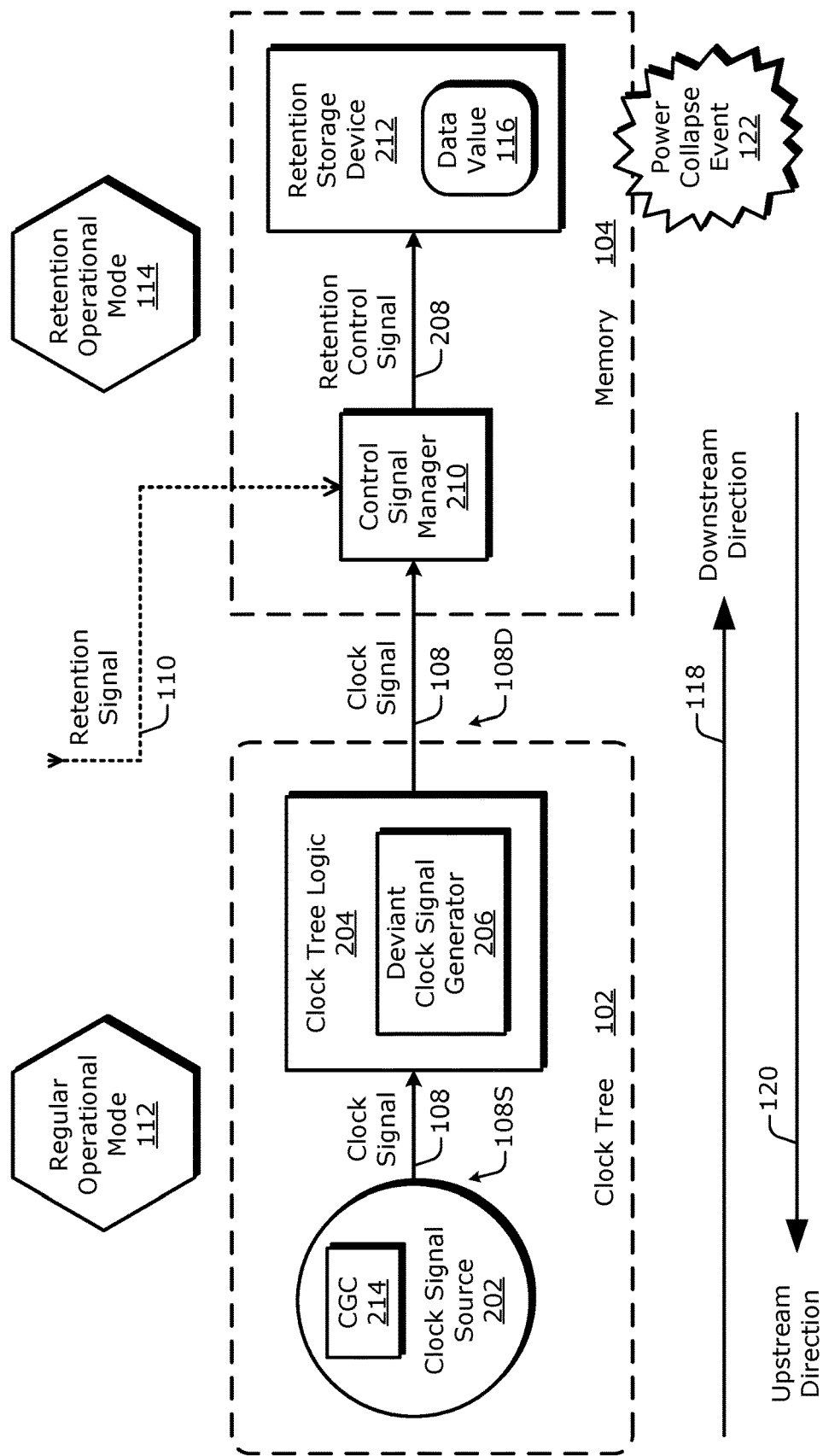
FIG. 2 illustrates example circuitry for the clock tree and the memory including a deviant clock signal generator and a control signal manager.

FIG. 2 illustrates generally at 200 example circuitry for the clock tree 102 and the memory 104 including a deviant clock signal generator 206 and a control signal manager 210. As shown, the clock tree 102 includes a clock signal source 202 and clock tree logic 204. The clock signal source 202 can include clock gating circuitry 214 (CGC). The clock tree logic 204 can include multiple different circuit devices, such as at least one deviant clock signal generator 206. The memory 104 includes the control signal manager 210 and a retention storage device 212. The retention storage device 212 stores at least one data value 116.

As illustrated along the downstream direction 118 for the clock signal 108, the clock signal source 202 is coupled to the deviant clock signal generator 206 of the clock tree logic 204, and the deviant clock signal generator 206 is coupled to the memory 104. Within the memory 104, the control signal manager 210 is coupled to the retention storage device 212. However, other, unillustrated circuitry may be disposed along the clock tree 102 or within the memory 104. Such other circuitry can also propagate or affect the value of the clock signal 108 or the retention control signal 208. Further, the order or locations of circuit elements can be arranged differently. For example, the control signal manager 210 can be included as part of the clock tree 102.

In an example operation, the clock signal source 202 generates or otherwise provides a clock signal 108 having a source value, which is referred to herein as a source clock signal 108S. The clock signal source 202 can receive a clock signal from clock tree circuitry that is disposed still farther along the upstream direction 120, can generate an oscillation signal from a phase-locked loop (PLL) device, and so forth. The clock signal source 202 provides the source clock signal 108S to downstream clock tree logic 204. The clock signal source 202 includes or functions as a safe clock source if, for example, the clock signal source 202 is designed to output a logical zero (0) value (e.g., a low voltage level) responsive to receiving a clock-disable signal (not shown). The clock-disable signal is asserted relatively early in a power-gating sequence prior to assertion of the retention signal 110. Thus, the clock gating circuitry 214 of the clock signal source 202 can halt oscillation of the source value of the clock signal 108 and cause the clock signal source 202 to produce a constant voltage level.

The clock tree logic 204 includes various circuit devices, such as buffers to increase signal strength, to enable the clock tree logic 204 to propagate the clock signal 108 to different areas and components of an integrated circuit. Typically, such circuit devices do not change the source value of the clock signal 108 as provided by the clock signal source 202. However, some circuit devices of the clock tree logic 204 can alter the source value in ways that are unpredictable, in manners that flip the logical value or invert the voltage level, and so forth. Such circuit devices, either singly or jointly, that cause a deviation in the value of the clock signal 108 are referred to herein as a deviant clock signal generator 206.

Thus, the deviant clock signal generator 206 causes the value of the clock signal 108 that is propagated farther along the downstream direction 118 to have an indeterminate value, to be altered as compared to the source value from the clock signal source 202, some combination thereof, and so forth. Such different values are referred to herein as deviant values of the clock signal 108. The clock signal 108 that has a deviant value is referred to herein as a deviant clock signal 108D. Examples of circuit devices that function as a deviant clock signal generator 206 along the clock tree 102 include: one or more inverters in series having an odd total number of inverters, a register, or an XOR gate. Other circuitry examples that result in deviant clock signal generators 206 include: combinational logic with an unknown clock value before a power collapse or after waking up from one, at least one multiplexer along the clock path, or a clock divider directly driving the clock signal.

After propagation downstream from the deviant clock signal generator 206, the deviant clock signal 108D is immediately or eventually provided to the memory 104 or to the control signal manager 210. The control signal manager 210 receives the clock signal 108 having the deviant value and the retention signal 110. Based on the deviant clock signal 108D and responsive to a state of the retention signal 110, the control signal manager 210 produces the retention control signal 208. The retention control signal 208 functions as a combined clock and retention signal to control operation of the retention storage device 212. The retention control signal 208 manages operation of the retention storage device 212 during the regular operational mode 112 for memory accessing operations and during the retention operational mode 114 for retention operations intended to secure the data value 116 during the power collapse event 122. An example approach to implement the control signal manager 210 is described herein with reference to FIGS. 11 and 12.

Figure 3:
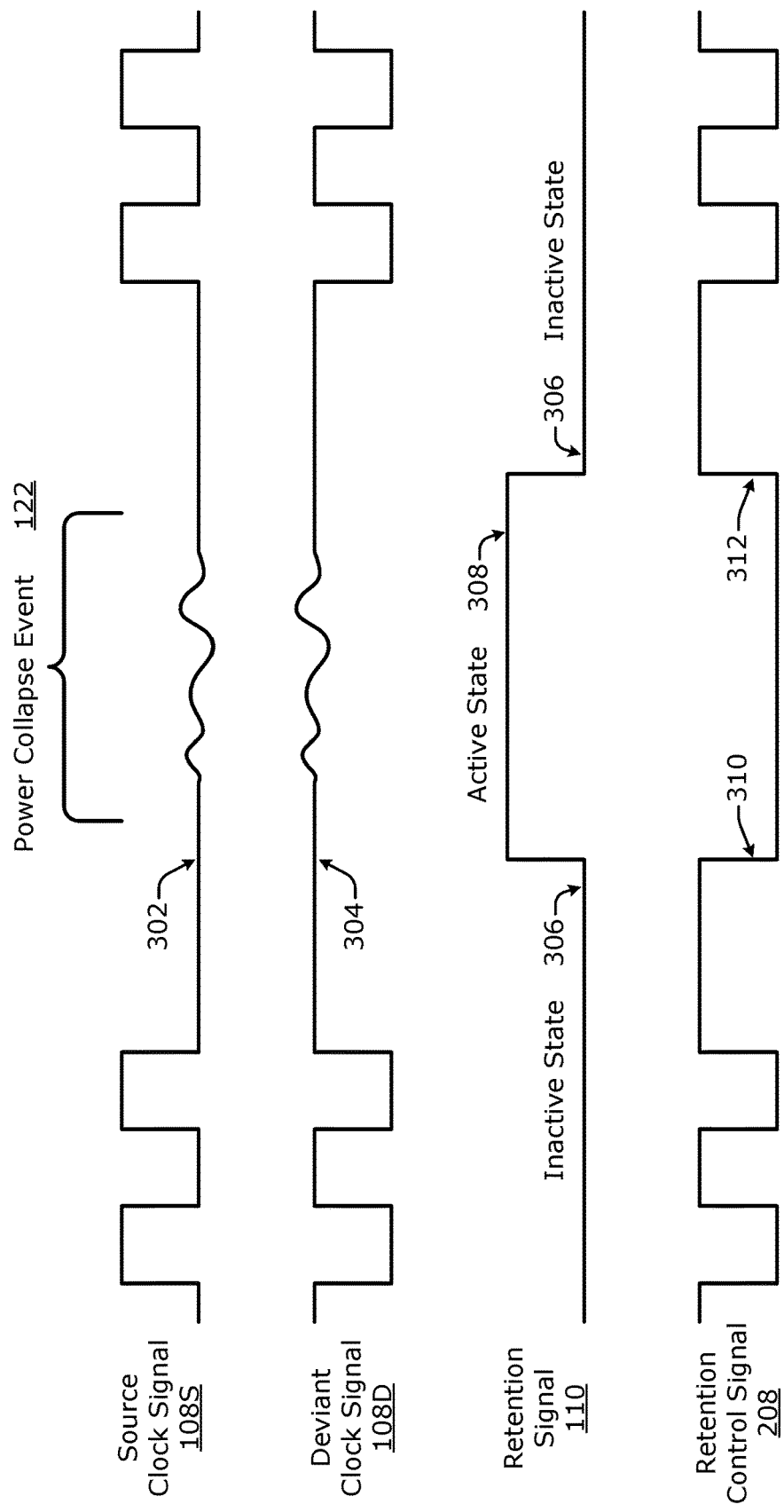
FIG. 3 depicts example digital signal waveforms including ones for a deviant clock signal from the deviant clock signal generator and a retention control signal from the control signal manager, without a clock glitch prevention implementation.

FIG. 3 depicts example digital signal waveforms 300 including ones for a deviant clock signal 108D from the deviant clock signal generator 206 (of FIG. 2) and a retention control signal 208 from the control signal manager 210, without a clock glitch prevention implementation. The digital signal waveforms 300 further include the source clock signal 108S output by the clock signal source 202, as well as the retention signal 110. An example timing of the power collapse event 122 is also depicted.

As illustrated in FIG. 3, the source clock signal 108S has multiple oscillating pulses with rising edges and falling edges, which are also referred to as positive edges and negative edges, respectively. The clock signal source 202 includes circuitry to gate the clock signal 108 to conserve power. As part of a retention operational mode 114, the clock signal source 202 drives the clock signal 108 to a logical zero value, which corresponds to a low voltage level here. In a binary digital system, binary logical one and zero values are represented with a low (e.g., including zero) voltage level and a high voltage level. Thus, a binary digital system implements binary logic with digital circuit devices that operate using two different voltage levels. The high voltage level can take one of multiple possible higher voltage levels, depending on current processing demands—such as voltage levels corresponding to standard, high, and turbo operating modes. In example implementations, the clock signal source 202 causes the source clock signal 108S to take on a constant voltage level—such as a low voltage level—as shown at an arrow 302 in preparation for the power collapse event 122 of the retention operational mode 114.

In this example, the deviant clock signal generator 206 is formed from three inverters, which results in the deviant clock signal 108D having an inverted or opposite voltage level in comparison to that of the source clock signal 108S. Because the clock signal is alternating between high and low values to produce rising and falling edges, the difference between the deviant clock signal 108D and the source clock signal 108S does not adversely affect operation of the retention storage device 212 in the regular operational mode 112. However, just before the beginning of the power collapse event 122, the deviant clock signal 108D has a high voltage level as shown at an arrow 304. Meanwhile, the retention signal 110 is changing states to indicate that a power collapse event 122 is imminent. The retention signal 110 is in an inactive state 306 at a low voltage level during a regular operational mode 112. Upon being asserted, the retention signal 110 enters an active state 308 at a high voltage level for the retention operational mode 114.

With reference also to FIG. 2, in which no clock glitch prevention circuitry is implemented, the control signal manager 210 receives the retention signal 110 and the deviant clock signal 108D. The deviant clock signal 108D has a high voltage level when the retention signal 110 becomes active. However, the control signal manager 210 is designed to manage the retention storage device 212 to maintain the data value 116 during the power collapse event 122 based on an expectation that the received clock signal 108 has a low voltage level when the retention signal 110 becomes active. Because the clock signal 108 as received at the control signal manager 210 does not have the expected low voltage level, the control signal manager 210 produces spurious edges that adversely impact the retention storage device 212.

With continuing reference to FIGS. 2 and 3, the retention storage device 212 is designed in example implementations to retain the data value 116 if the retention control signal 208 is clamped low, with no spurious edges. Because the clock signal 108 is unexpectedly at a high level at arrow 304, the control signal manager 210 produces a spurious falling edge 310 when the retention signal 110 becomes active and a spurious rising edge 312 when the retention signal 110 is de-asserted. These spurious edges can cause the retention storage device 212 to take on a new voltage for the data value 116 although the actual source clock signal 108S does not intend for the retention storage device 212 to change values. Thus, the spurious falling edge 310 or the spurious rising edge 312 can cause incorrect data to be loaded, retained, or output by the retention storage device 212.

A specific example in which the retention storage device 212 is implemented as a retention flip-flop is described next. For a falling-edge-triggered retention flip-flop, the spurious rising edge 312 does not cause a trigger, but the spurious falling edge 310 does. However, because the spurious falling edge 310 occurs before the power collapse event 122 occurs, the falling-edge-triggered retention flip-flop merely latches the same, correct data. Hence, the falling-edge-triggered retention flip-flop is not adversely impacted in this particular example. A rising-edge-triggered retention flip-flop, on the other hand, is adversely impacted. Although the spurious falling edge 310 does not trigger the rising-edge-triggered retention flip-flop, the spurious rising edge 312 does cause a triggering thereof. This triggering responsive to the spurious rising edge 312 causes the rising-edge-triggered retention flip-flop to latch unknown, unreliable data after the conclusion of the power collapse event 122. This unreliability caused by the deviant clock signal generator 206 is addressed by incorporating a clock signal controller into the clock path, as shown in FIG. 4.

Figure 4:
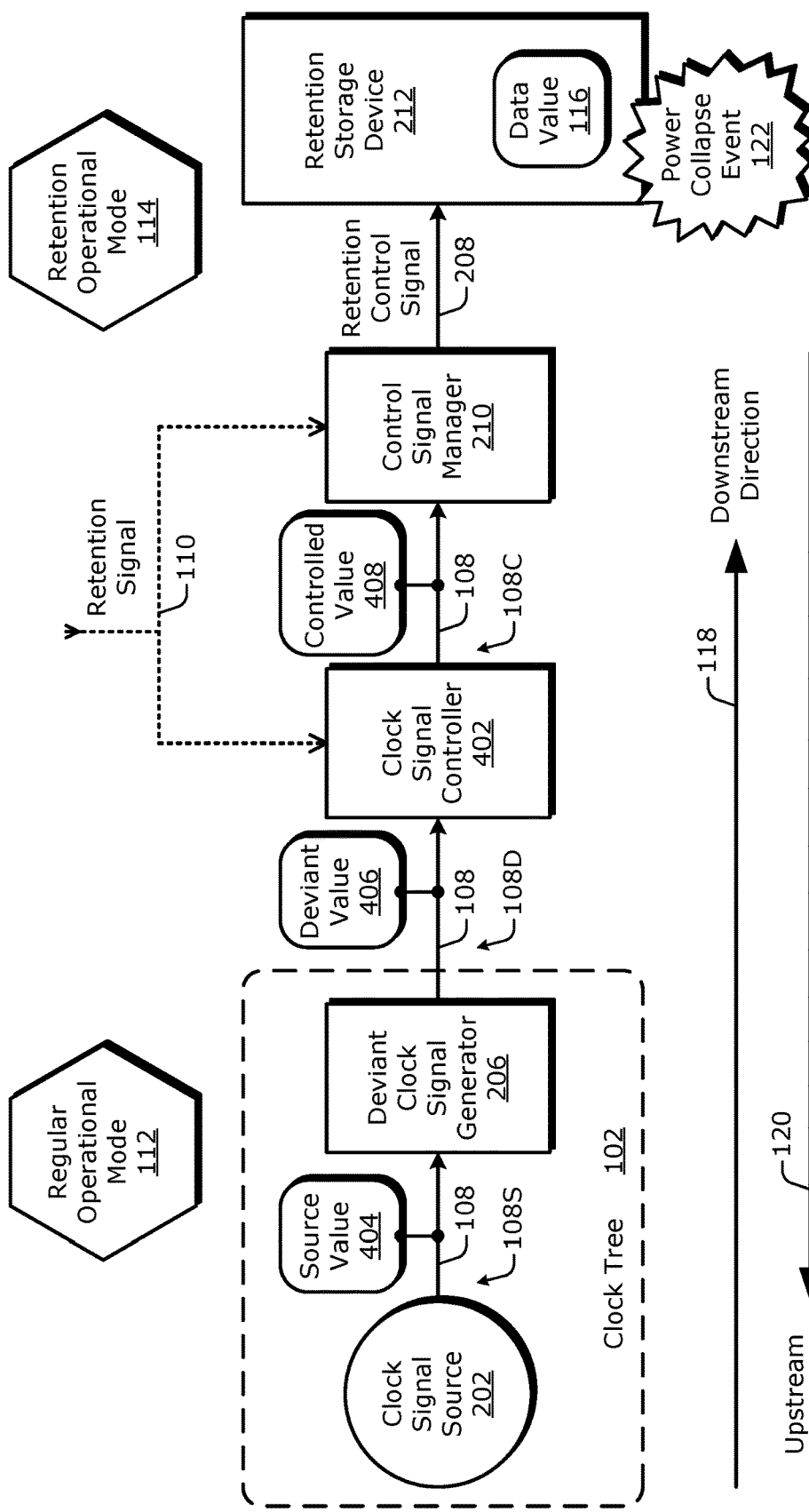
FIG. 4 illustrates example circuitry for clock glitch prevention including a clock signal controller for a retention operational mode in conjunction with a retention storage device.

FIG. 4 illustrates generally at 400 example circuitry for clock glitch prevention including a clock signal controller 402 for a retention operational mode 114 in conjunction with a retention storage device 212. A clock path including a clock tree 102 is shown having a downstream direction 118 and an upstream direction 120. The downstream direction 118 extends at least from the clock signal source 202 to the control signal manager 210 with the upstream direction 120 extending in the opposite direction.

The clock signal controller 402 is disposed along the clock path between the deviant clock signal generator 206 and the control signal manager 210. Thus, the clock signal controller 402 is coupled to the deviant clock signal generator 206 in the downstream direction 118 and is coupled upstream to the control signal manager 210. Although not shown in FIG. 4, other circuit devices may be interspersed along the clock path. Also, the illustrated circuit elements may be coupled in different orders. Alternative circuit arrangements are described herein with reference to FIGS. 9 and 10.

The value of the clock signal 108 at different points along the clock path are explicitly depicted in FIG. 4. The clock signal 108 at the output of the clock signal source 202 has a source value 404 to provide the source clock signal 108S. The clock signal 108 at the output of the deviant clock signal generator 206 has a deviant value 406 to form the deviant clock signal 108D. The deviant value 406 differs from the source value 404, at least with regard to the retention operational mode 114. The clock signal 108 at the output of the clock signal controller 402 has a controlled value 408 to realize a controlled clock signal 108C.

The clock signal controller 402 receives the deviant clock signal 108D, which is the clock signal 108 as affected by the deviant clock signal generator 206. The clock signal controller 402 also receives the retention signal 110, which is indicative of the start of the retention operational mode 114 for an imminent power collapse event 122. In operation, the clock signal controller 402 prevents downstream propagation of the deviant value 406 of the clock signal 108 responsive to the retention signal 110. By way of example, the clock signal controller 402 substitutes the source value 404 as the controlled value 408 responsive to an active state of the retention signal 110. A description of a logical operation of an example implementation of the clock signal controller 402 is set forth with reference to FIG. 5.

Figure 5:
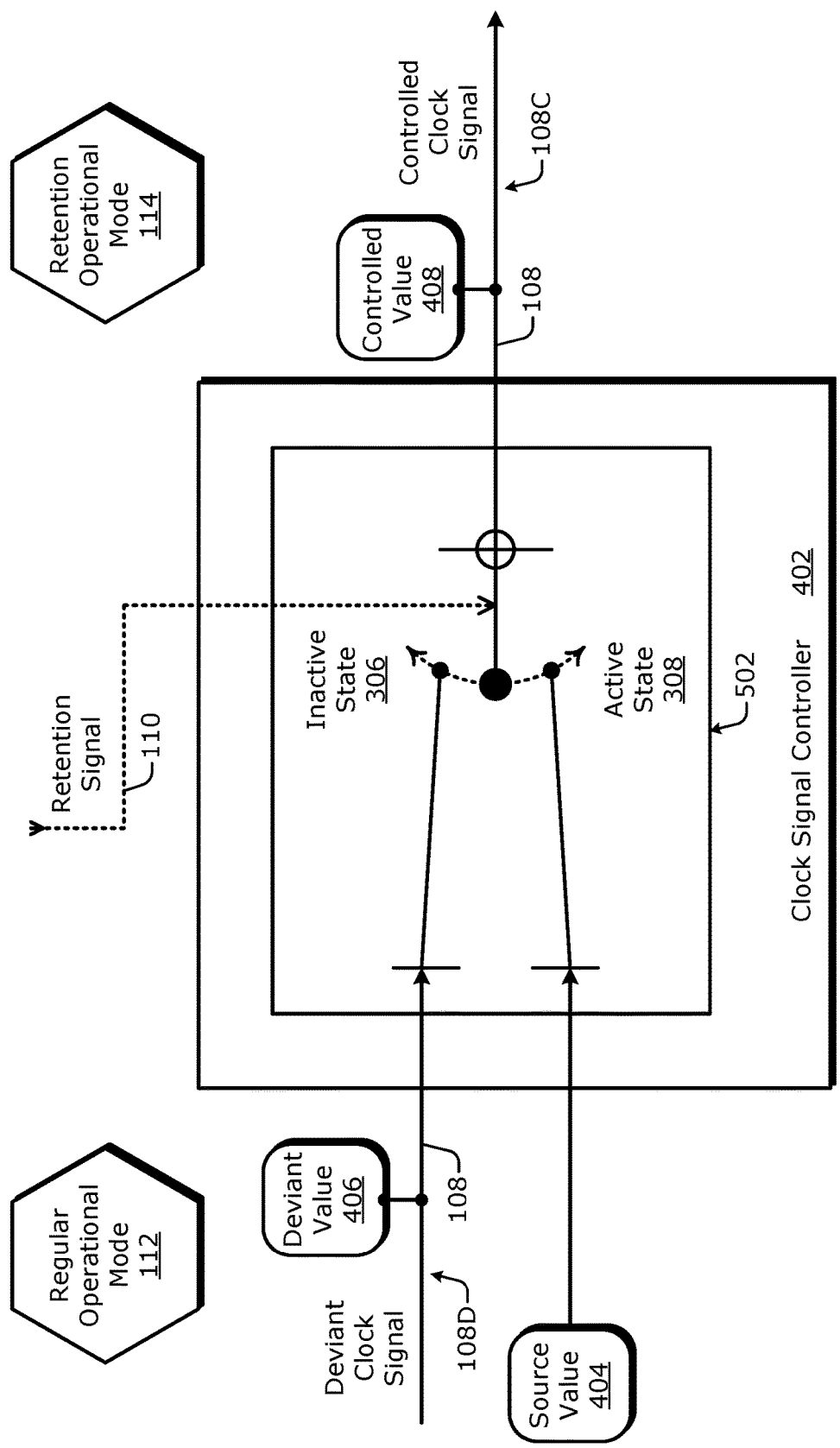
FIG. 5 illustrates an example logical schematic diagram for a clock signal controller.

FIG. 5 illustrates an example logical schematic diagram 500 for a clock signal controller 402. The clock signal controller 402 includes a logical switch 502 that implements clock signal controlling functionality for clock signal controlling circuitry. The logical switch 502 receives as inputs the deviant clock signal 108D and the source value 404. The logical switch outputs the controlled clock signal 108C. The logical switch 502 is controlled by the retention signal 110 based on a state of the retention signal 110.

Thus, the clock signal controller 402 outputs a value as the controlled clock signal 108C based on the deviant clock signal 108D and responsive to the retention signal 110. If the retention signal 110 is in the inactive state 306, then the logical switch 502 is in the upper position, and the clock signal controller 402 passes the deviant value 406 of the clock signal 108 downstream as a controlled value 408 for the clock signal 108. This corresponds to the regular operational mode 112. If the retention signal 110 is in the active state 308, then the logical switch 502 is in the lower position, and the clock signal controller 402 forwards a value, which matches the source value 404 of the clock signal 108 in preparation for a retention operational mode 114, downstream as the controlled value 408 for the clock signal 108. The source value 404 can include a logical zero (0), or low voltage level. This forwarding of the source value 404 as the controlled value 408 to produce the controlled clock signal 108C corresponds to the retention operational mode 114. Thus, instead of a deviant high voltage level, the clock signal controller 402 drives a low voltage level for the retention operational mode 114 as described below with reference to the digital signal waveforms depicted in FIG. 6.

Figure 6:
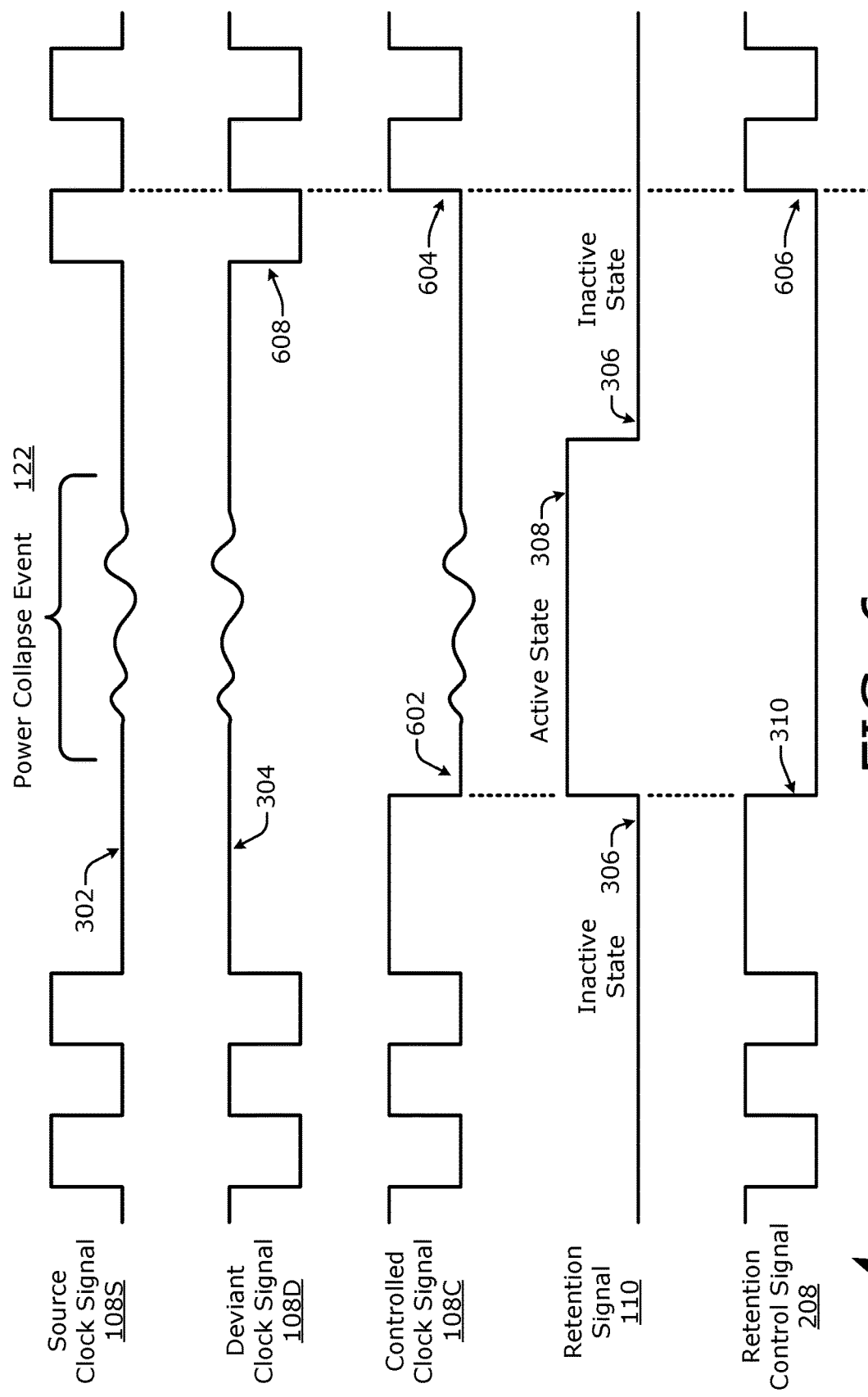
FIG. 6 depicts example digital signal waveforms including ones for a controlled clock signal from the clock signal controller and a retention control signal from the control signal manager, with a clock glitch prevention implementation.

FIG. 6 depicts example digital signal waveforms 600 including ones for a controlled clock signal 108C from the clock signal controller 402 and a retention control signal 208 from the control signal manager 210, with a clock glitch prevention implementation. The source clock signal 108S, the deviant clock signal 108D, and the retention signal 110 are the same as the versions depicted in FIG. 3, which corresponds to implementations that lack clock glitch prevention. In FIG. 6, however, a signal waveform for the controlled clock signal 108C is added. This new signal waveform for the controlled clock signal 108C affects the retention control signal 208, so the retention control signal 208 that is depicted in FIG. 6 differs from that of FIG. 3.

With reference to the controlled clock signal 108C, if the retention signal 110 is in the inactive state 306, the clock signal controller 402 (of FIGS. 4 and 5) passes the deviant clock signal 108D as the controlled clock signal 108C. However, if the retention signal 110 enters the active state 308, the clock signal controller 402 swallows the incoming deviant clock signal 108D by preventing the incoming clock signal pulses from propagating any further downstream. Instead of continuing to pass the deviant value 406, the clock signal controller 402 drives as the controlled clock signal 108C a retention-capable value. A retention-capable value is a value that enables downstream retention-related circuitry, such as the control signal manager 210, to implement a retention feature responsive to the retention signal 110. For example, the clock signal controller 402 can drive a voltage level that is the same as that of the safe source clock signal 108S in preparation for the power collapse event 122. This constant voltage level—such as a low voltage level—of the controlled clock signal 108C is indicated by an arrow 602 where the retention signal 110 is asserted. The controlled clock signal 108C remains low until the regular operational mode 112 returns, which is where the retention signal is de-asserted, and the deviant clock signal 108D also transitions again from low to high with a rising edge, as indicated by an arrow 604.

With reference to the retention control signal 208, the spurious falling edge 310 remains. However, as explained above, this spurious falling edge 310 does not adversely impact rising-edge-triggered retention flip-flops or falling-edge-triggered retention flip-flops. The spurious rising edge 312 of FIG. 3 is no longer present due to the controlled clock signal 108C produced by the clock signal controller 402. Consequently, rising-edge-triggered retention flip-flops can be employed for the retention storage devices 212 in the memory 104 while data values 116 are reliably maintained for the retention operational mode 114.

As indicated by an arrow 606, the first rising edge of the retention control signal 208 after the power collapse event 122 matches the first rising edge of the deviant clock signal 108D. Hence, no rising edge signaling is missed for rising-edge-triggered retention flip-flops, and no clock glitch remains to adversely impact such rising-edge-triggered retention flip-flops. However, a first falling edge of the deviant clock signal 108D after the power collapse event 122 as shown at an arrow 608 is not propagated to the retention control signal 208 in certain example implementations. Accordingly, the operation of negative-edge-triggered retention flip-flops can be adversely impacted. Example approaches to handling this difference between positive- and negative-edge-triggered retention flip-flops is described below with reference to FIG. 13.

Figure 7:
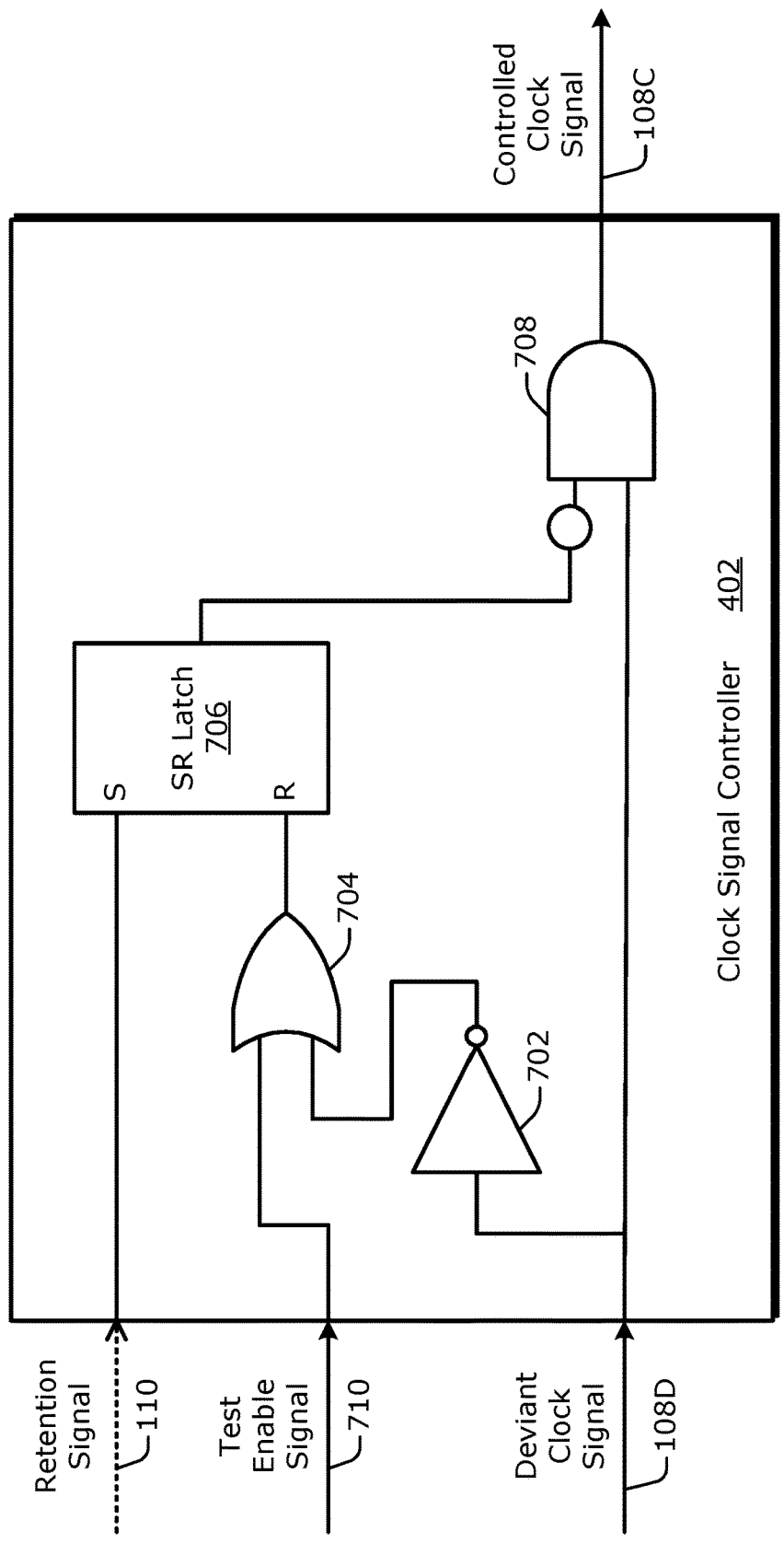
FIG. 7 illustrates an example device-level schematic diagram for a clock signal controller in an environment in which data values are isolated for the data retention period using a logical low value.

FIG. 7 illustrates an example device-level schematic diagram 700 for a clock signal controller 402 in an environment in which data values are isolated for the data retention period using a logical low value. The device-level schematic diagram 700 depicts an example of clock signal controlling circuitry that is applicable to implementations in which a data value 116 of a retention storage device 212 is isolated for a power collapse event 122 using a signal that is clamped low (e.g., by a control signal manager 210). The clock signal controller 402 receives as inputs the retention signal 110, a test enable signal 710, and the deviant clock signal 108D. The clock signal controller 402 provides as an output the controlled clock signal 108C.

As shown, the clock signal controller 402 includes an inverter 702, an OR gate 704, a latch 706, and an AND gate 708 that has an inverting input and a non-inverting input. Here, the latch 706 is implemented as a set-rest (SR) latch. The test enable signal 710 and the OR gate 704 can be included in accordance with design for testability (DFT)

practices. In a DFT mode, the clock signal controller 402 can become transparent. The retention signal 110 is coupled to the set input of the latch 706. The test enable signal 710 is coupled to a first input of the OR gate 704. The deviant clock signal 108D is coupled to an input of the inverter 702 and the non-inverting input of the AND gate 708. The output of the inverter 702 is coupled to a second input of the OR gate 704. The output of the OR gate 704 is coupled to the reset input of the latch 706. An output of the latch 706 is coupled to the inverting input of the AND gate 708. The output of the AND gate 708 produces the controlled clock signal 108C.

In an example operation, for the regular operational mode 112, the retention signal 110 is a logical zero (0), so the latch is not set. Thus, the latch 706 is outputting a logical 0, which is inverted to a logical one (1) at the inverting input of the AND gate 708. Consequently, the deviant clock signal 108D is passed through the AND gate 708 unchanged as the controlled clock signal 108C. For the retention operational mode 114, the retention signal 110 is asserted and presents a logical 1 at the set input of the latch 706. The output of the latch 706 therefore goes high to a logical 1. This logical 1 is inverted at the inverting input of the AND gate 708, which results in a controlled, constant value corresponding to a logical 0 at the output of the AND gate 708 as the controlled clock signal 108C. This constant value matches the source value 404 (of FIG. 4) applied to the clock signal 108 by the clock signal source 202 to produce the source clock signal 108S in preparation for the power collapse event 122 (e.g., based on a clock-disable signal).

The latch 706 causes the clock signal controller 402 to continue to output the logical 0 as the controlled clock signal 108C until the retention signal 110 has the inactive state 306 and the clock signal transitions (e.g., the deviant clock signal 108D transitions) from a logical 0 to a logical 1. However, because the deviant clock signal 108D has a constant logical 1 value both before and immediately after the actual power collapse event 122, the output of the inverter 702 remains at a logical 0, and the latch 706 is not reset. As the regular operational mode 112 is reinitiated, the retention signal 110 is de-asserted and returns to a logical 0. Also, the deviant clock signal 108D falls back to a logical 0, as indicated by the arrow 608 in FIG. 6. This logical 0 is inverted by the inverter 702, and the OR gate 704 forwards the resulting logical 1 to the reset input of the latch 706. The latch 706 therefore outputs a logical 0, which is inverted by the inverting input of the AND gate 708. The AND gate 708 can therefore once again pass the deviant clock signal 108D as the controlled clock signal 108C.

Although an SR latch is used as the latch 706, other latches, as well as other circuit designs, can be alternatively implemented to realize the prescribed functionality of a clock signal controller 402 having clock signal controlling circuitry. Generally, the clock signal controller 402 drives the controlled clock signal 108C to a logical 0 value (e.g., a low voltage level) responsive to an assertion of the retention signal 110. After the retention signal 110 is de-asserted, the controlled clock signal 108C is to remain at the logical 0 value until the deviant clock signal 108D undergoes a zero-to-one transition. Responsive to this rising edge transition, the clock signal controller 402 then outputs the controlled clock signal 108C so as to mirror the deviant clock signal 108D.

Thus, other circuit designs can be implemented for the clock signal controller 402 to realize this functionality. For example, the latch 706 can be realized using a D latch having a "d" input and a "q" output. In such an implementation, the retention signal 110 is fed through an inverter to the "d" input of the D latch and to an upper input of an input AND gate. The "q" output of the D latch is applied to an upper input of an output AND gate. The deviant clock signal 108D is fed to a lower input of the input AND gate. The output of the input AND gate is applied to an enable or clocking input of the D latch and a lower input of the output AND gate. The output of the output AND gate serves as the controlled clock signal 108C.

Figure 8:
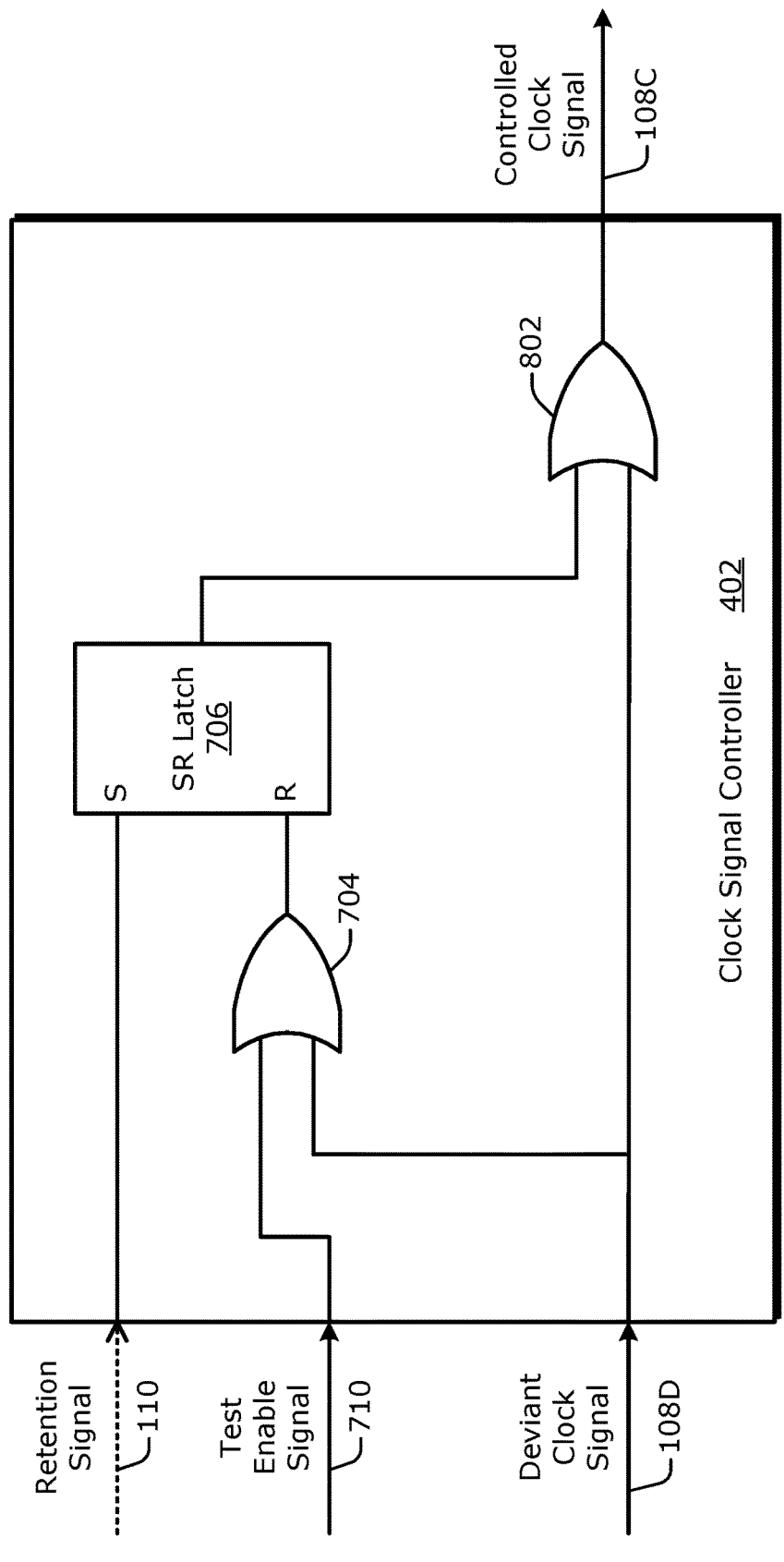
FIG. 8 illustrates an example device-level schematic diagram for a clock signal controller in an environment in which data values are isolated for the data retention period using a logical high value.

FIG. 8 illustrates an example device-level schematic diagram 800 for a clock signal controller 402 in an environment in which data values are isolated for the data retention period using a logical high value. The device-level schematic diagram 800 depicts an example of clock signal controlling circuitry that is applicable to implementations in which a data value 116 of a retention storage device 212 is isolated for a power collapse event 122 using a signal that is clamped high (e.g., by a control signal manager 210). The clock signal controller 402 receives as inputs the retention signal 110, the test enable signal 710, and the deviant clock signal 108D. The clock signal controller 402 provides as an output the controlled clock signal 108C. The device-level schematic diagram 800 is relevant to the reverse situation as compared to that of the device-level schematic diagram 700. Hence, the clock signal controller 402 of FIG. 8 applies when there are falling-edge-triggered retention flip-flops in a downstream fan-out, as opposed to when there are rising-edge-triggered retention flip-flops in a downstream fan-out.

As shown, the clock signal controller 402 includes an OR gate 704, a latch 706, and an OR gate 802. Here, the latch 706 is implemented as a set-rest (SR) latch. The test enable signal 710 and the OR gate 704 can be included in accordance with DFT practices. The retention signal 110 is coupled to the set input of the latch 706. An output of the latch 706 is coupled to a first input of the OR gate 802. The test enable signal 710 is coupled to a first input of the OR gate 704. The output of the OR gate 704 is coupled to the reset input of the latch 706. The deviant clock signal 108D is coupled to a second input of the OR gate 704 and a second input of the OR gate 802. The output of the OR gate 802 produces the controlled clock signal 108C.

In an example operation, for the regular operational mode 112, the retention signal 110 is a logical 0, so the latch 706 is not set. Thus, the latch 706 is outputting a logical 0 to the first input of the OR gate 802. Consequently, the deviant clock signal 108D is passed through the OR gate 802 unchanged as the controlled clock signal 108C. For this reverse situation, the source value 404 can be driven high by the clock signal source 202 in response to a clock disable signal. Thus, the deviant value 406 of the deviant clock signal 108D in this reverse situation has a logical zero value for the retention operational mode 114. For the retention operational mode 114, the retention signal 110 is asserted and presents a logical 1 at the set input of the latch 706. The output of the latch 706 therefore goes high to a logical 1. This logical 1 is applied to the first input of the OR gate 802, which produces a controlled, constant value corresponding to a logical 1 at the output of the OR gate 802 as the controlled clock signal 108C.

Because the deviant clock signal 108D has a constant logical 0 value both before and immediately after the actual power collapse event 122, the output of the OR gate 704 is a logical 0, and the latch 706 is not reset because no rising edge is yet applied to the reset input of the latch 706. As the regular operational mode 112 is reinitiated, the retention signal 110 is de-asserted and returns to a logical 0. Also, the deviant clock signal 108D eventually returns to a logical 1 due to the oscillating clock signal. With the next rising edge, the OR gate 704 forwards the rising-edge logical 1 to the reset input of the latch 706. The latch 706 therefore outputs a logical 0 for the first input of the OR gate 802. The OR gate 802 can therefore once again pass the deviant clock signal 108D, which arrives at the second input thereof, as the controlled clock signal 108C.

Figure 9:
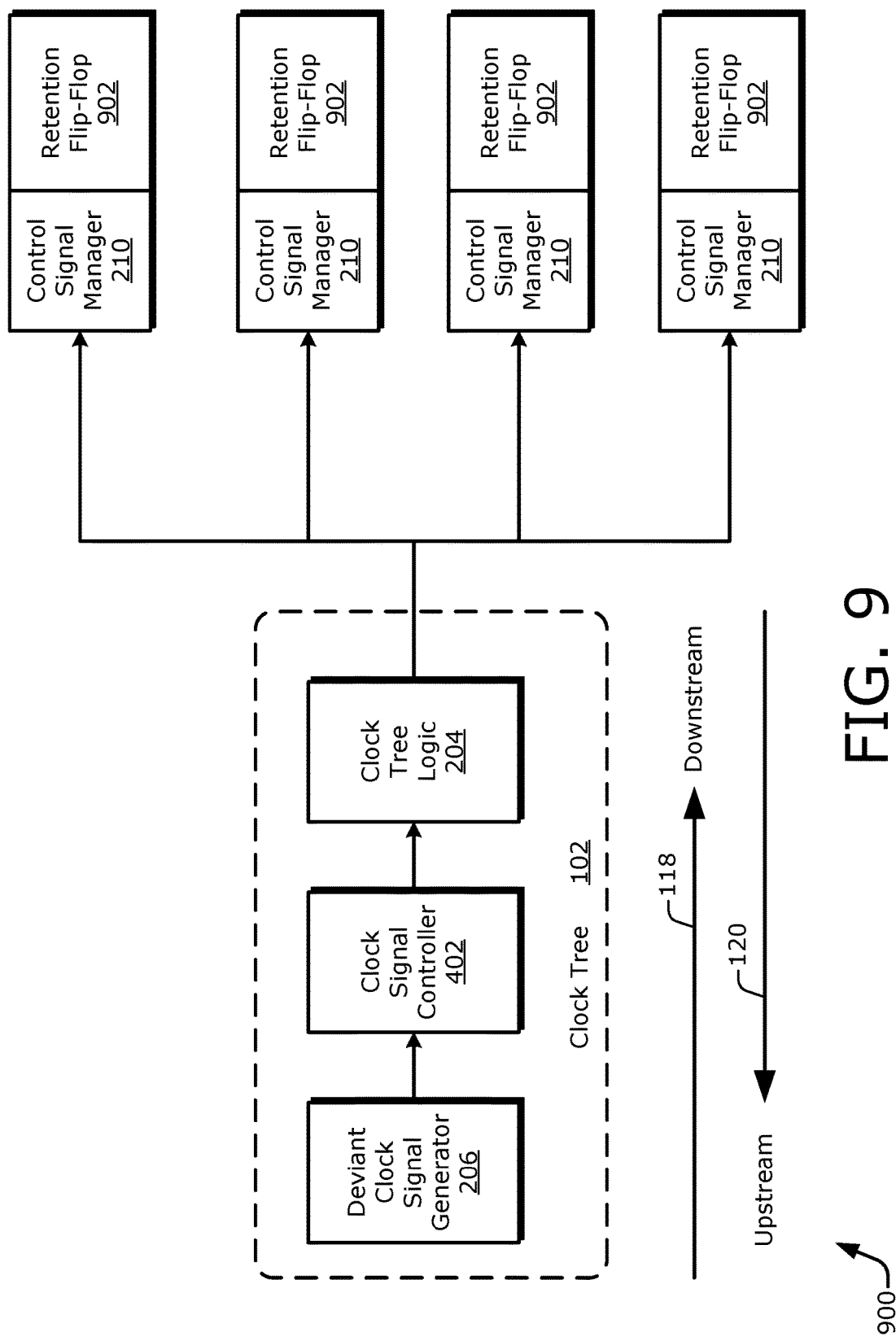
FIG. 9 illustrates an example arrangement in which circuitry for a clock signal controller and a control signal manager are disposed at one set of circuit locations.
Figure 10:
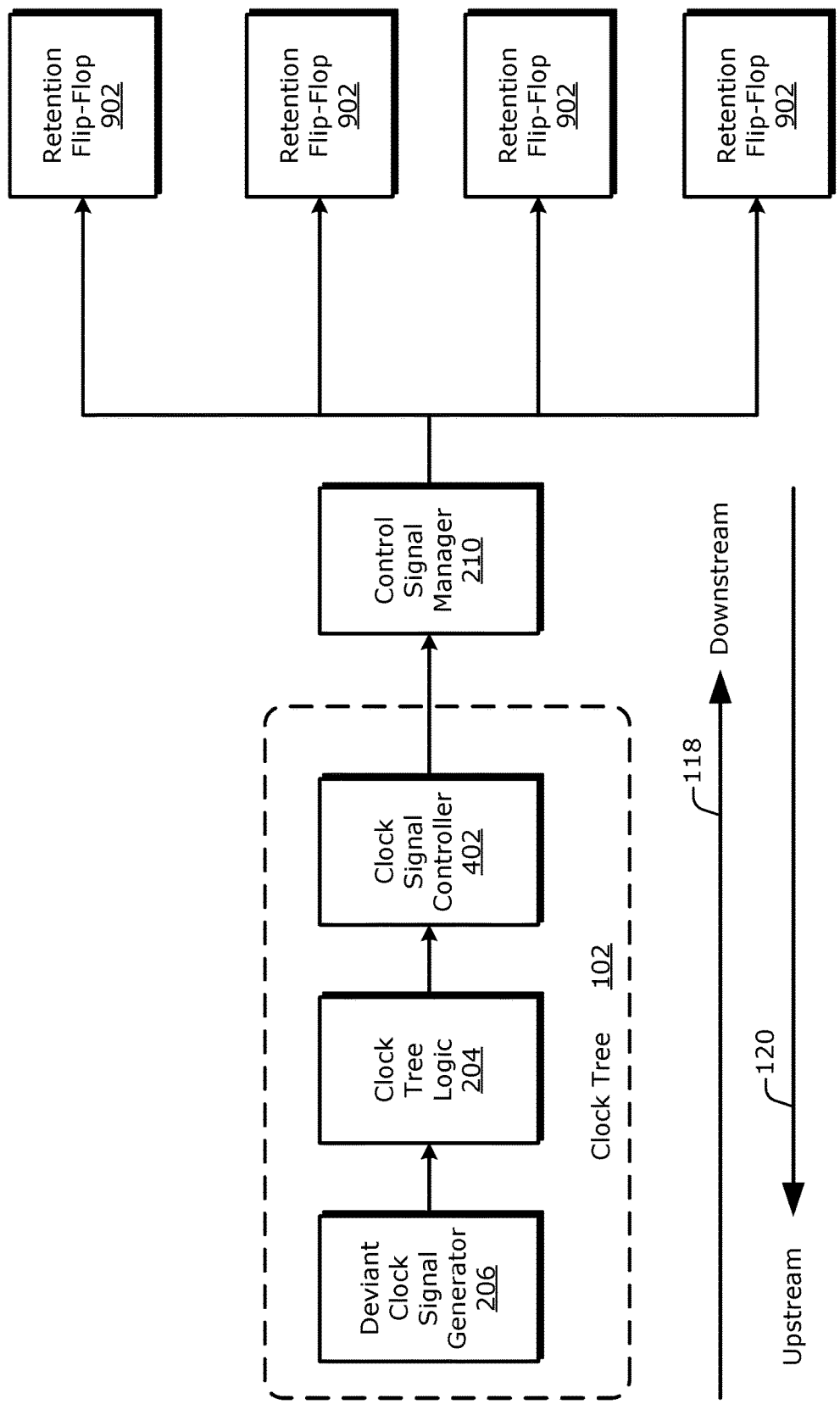
FIG. 10 illustrates another example arrangement in which circuitry for a clock signal controller and a control signal manager are disposed at another set of circuit locations.

FIG. 9 illustrates an example arrangement 900 in which circuitry for a clock signal controller 402 and a control signal manager 210 are disposed at one set of circuit locations. FIG. 10 illustrates another example arrangement 1000 in which circuitry for a clock signal controller 402 and a control signal manager 210 are disposed at another set of circuit locations. In the arrangements 900 and 1000, retention storage devices 212 are implemented as retention flip-flops 902. Example implementations for the retention flip-flops 902 are described below with reference to FIG. 12.

In both of FIGS. 9 and 10, the clock path is illustrated with regard to the downstream direction 118 and the upstream direction 120. The clock path includes the clock tree 102 and is shown extending from the deviant clock signal generator 206 in the downstream direction 118 to at least the control signal manager 210. Along the clock path, the clock signal controller 402 and the control signal manager 210 are disposed between the deviant clock signal generator 206 and the retention flip-flops 902. Generally, the clock path is shown to be routed so as to fan out to multiple retention flip-flops 902. Although four retention flip-flops 902 are shown per fan-out, more or fewer may be included per fan-out. Also, multiple fan-outs from the clock tree 102 for other retention flip-flops 902 may be implemented.

In FIG. 9, a respective control signal manager 210 is disposed with each respective retention flip-flop 902 and can be external to or internal of the respective retention flip-flop 902. In such an implementation, the control signal manager 210 can be incorporated with the circuitry of the retention flip-flop 902. For instance, a control signal manager 210 and a retention flip-flop 902 pair can be combined into a single cell of a cell library. The clock signal controller 402 is disposed after the deviant clock signal generator 206 along the downstream direction 118. As illustrated, the clock signal controller 402 is located far upstream of the retention flip-flops 902 such that the clock signal controller 402 is logically adjacent to the deviant clock signal generator 206. As indicated by the clock tree logic 204, other circuitry of the clock tree 102 may be interposed between the clock signal controller 402 and the control signal manager 210. Other arrangements may alternatively be implemented, such as that of FIG. 10. Further, aspects selected from the arrangements 900 and 1000 may be combined.

In FIG. 10, a single control signal manager 210 is disposed with and operatively coupled to multiple retention flip-flops 902. In such an implementation, the single control signal manager 210 manages the operation of multiple retention flip-flops 902, such as those that are part of one fan-out. The arrangement 1000 includes routing circuitry to route the retention control signal 208 from the control signal manager 210 to each of the multiple retention flip-flops 902. This approach occupies less area of the integrated circuit as compared to the arrangement 900. The clock signal controller 402 is disposed after the deviant clock signal generator 206 along the downstream direction 118.

As illustrated, the clock signal controller 402 is located far downstream of the deviant clock signal generator 206 such that the clock signal controller 402 is logically adjacent to the control signal manager 210. The clock signal controller 402 and the control signal manager 210 can be, for instance, combined into a single cell of a cell library. Such a combined cell can be powered with a collapsible power rail, which is described below with reference to FIG. 12. As indicated by the clock tree logic 204, other circuitry of the clock tree 102 may be interposed between the deviant clock signal generator 206 and the clock signal controller 402. Also, the clock signal controller 402 can alternatively be located more upstream than is illustrated, including by being disposed logically adjacent to the deviant clock signal generator 206.

Figure 11:
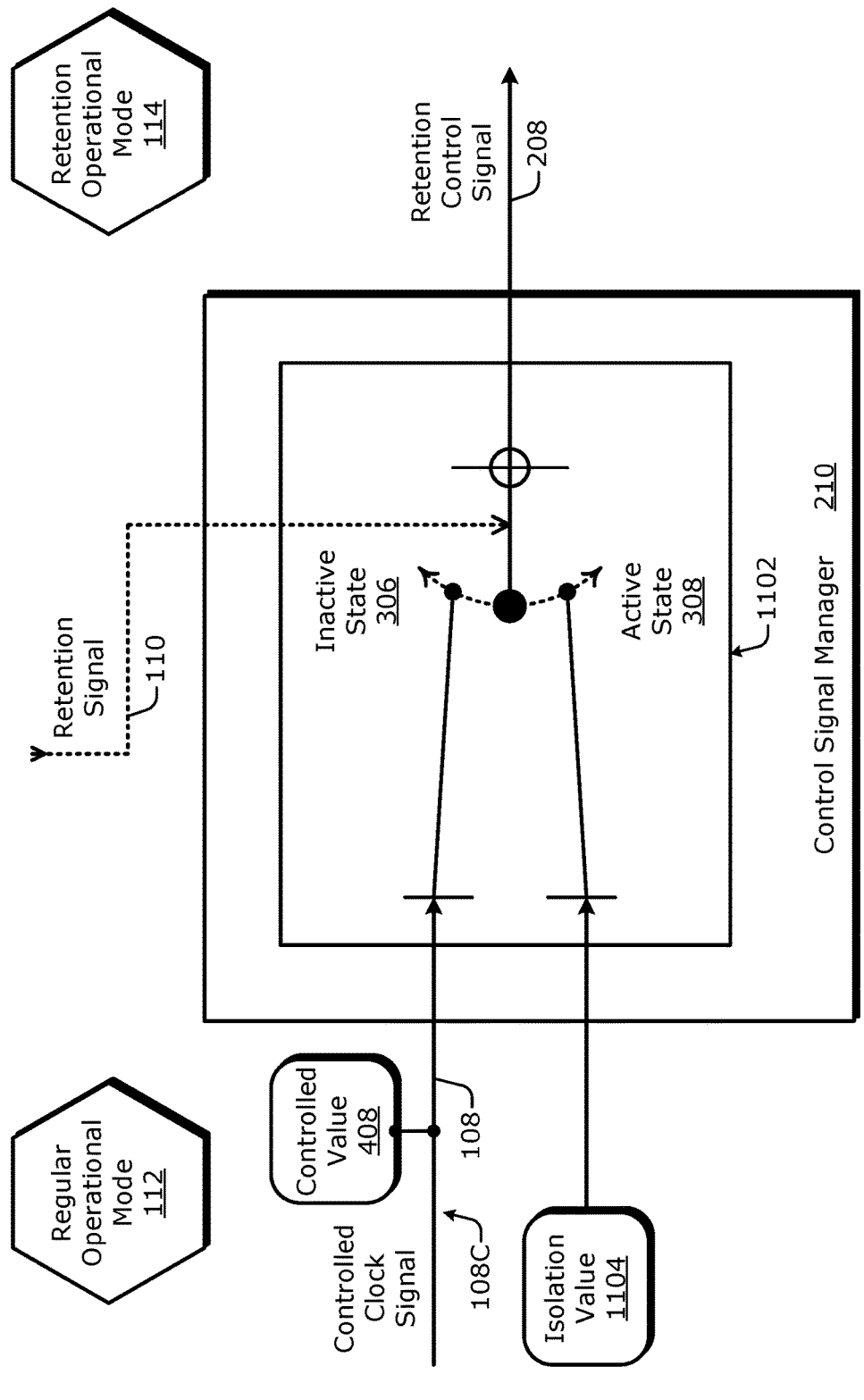
FIG. 11 illustrates an example logical schematic diagram for a control signal manager.

FIG. 11 illustrates an example logical schematic diagram 1100 for a control signal manager 210. The control signal manager 210 includes a logical switch 1102 that implements functionality for control signal managing circuitry to combine a clock signal and a retention signal or to otherwise produce control signaling to manage at least one retention storage device 212 (of FIGS. 2 and 4). The logical switch 1102 receives as inputs the controlled clock signal 108C and an isolation value 1104. The logical switch 1102 outputs the retention control signal 208. The logical switch 1102 is controlled by the retention signal 110 based on a state of the retention signal 110.

Thus, the control signal manager 210 outputs a value as the retention control signal 208 based on the controlled clock signal 108C and responsive to the retention signal 110. If the retention signal 110 is in the inactive state 306, then the logical switch 1102 is in the upper position, and the control signal manager 210 passes the controlled value 408 of the clock signal 108 downstream as the retention control signal 208. This corresponds to the regular operational mode 112. If the retention signal 110 is in the active state 308, then the logical switch 1102 is in the lower position, and the control signal manager 210 forwards the isolation value 1104 downstream as the retention control signal 208. The isolation value 1104 on the retention control signal 208 has a voltage level that isolates the data value 116 of a retention storage device 212. This forwarding of the isolation value 1104 as the retention control signal 208 corresponds to the retention operational mode 114. Thus, instead of an oscillating, a high, or a floating voltage level, the control signal manager 210 drives a low voltage level on the retention control signal 208 for the retention operational mode 114 as described below with reference to FIG. 12.

Figure 12:
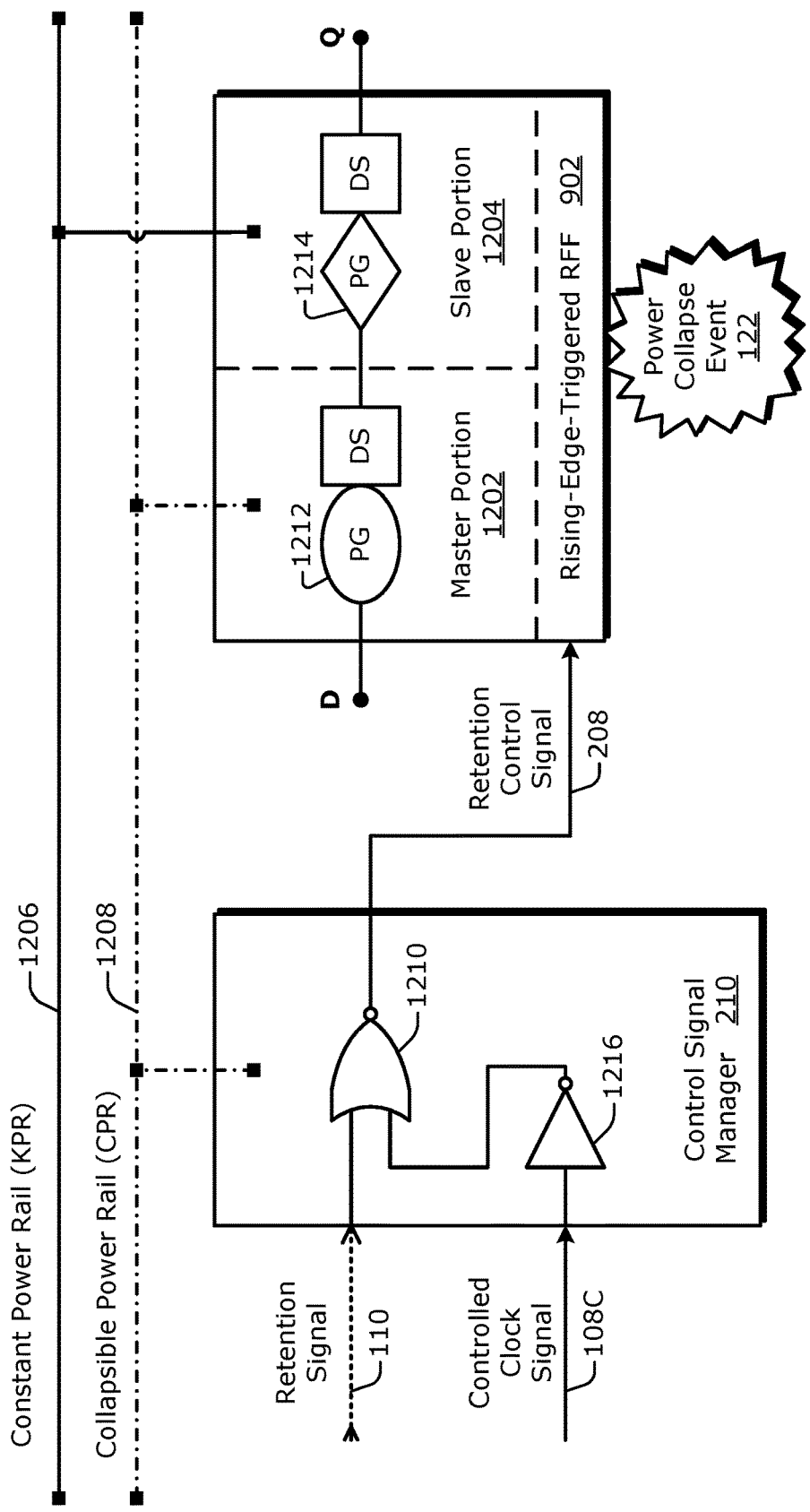
FIG. 12 illustrates an example schematic diagram for a control signal manager in conjunction with a retention storage device implemented as a retention flip-flop.

FIG. 12 illustrates an example schematic diagram 1200 for a control signal manager 210 in conjunction with a retention storage device that is implemented as a retention flip-flop 902. The schematic diagram 1200 also includes a constant power rail 1206 (KPR) and a collapsible power rail 1208 (CPR). Although the constant power rail 1206 may be capable of changing voltage levels and even losing power from time to time, the constant power rail 1206 maintains a voltage level while power is withdrawn from the collapsible power rail 1208 for purposes of the power collapse event 122 as described herein. The control signal manager 210 receives the retention signal 110 and the controlled clock signal 108C and produces the retention control signal 208. The control signal manager 210 provides the retention control signal 208 to one or more retention flip-flops 902. The principles described with reference to the schematic diagram 1200 are applicable to the arrangement 900 (of FIG. 9), the arrangement 1000 (of FIG. 10), combinations thereof, and so forth.

Because rising-edge-triggered retention flip-flops are typically more prevalent than falling-edge-triggered ones, the retention flip-flop 902 of FIG. 12 is described in terms of being triggered responsive to a rising edge of an incoming signal. The illustrated rising-edge-triggered retention flip-flop 902 includes a master portion 1202 and a slave portion 1204. The retention flip-flop 902 operates so as to advance data values through the master portion 1202 and the slave portion 1204 during the regular operational mode 112 responsive to rising pulses of the clock signal, which is provided as the retention control signal 208 during the regular operational mode 112.

As shown, the retention flip-flop 902 is configured as a live-slave retention flip-flop. Thus, the master portion 1202 is coupled to, and powered by, the collapsible power rail 1208. The slave portion 1204, on the other hand, is coupled to and powered by the constant power rail 1206. Like the master portion 1202, the control signal manager 210 is coupled to, and powered by, the collapsible power rail 1208. Consequently, the circuitry of the control signal manager 210 can be de-powered during the power collapse event 122.

Operation of the rising-edge-triggered retention flip-flop 902 is described in terms of transfer pass gates. In the described control scheme, pass gates of the retention flip-flop 902 are configured to operate so as to enable a selected live portion, which is the slave portion 1204 in FIG. 12, to retain data while another portion, the master portion 1202, is permitted to undergo a power collapse responsive to at least one signal. The master portion 1202 and the slave portion 1204 each include at least two components: a pass gate and a data storage unit. In FIG. 12, the rectangular-shaped components represent data storage units ("DS"), and the oval- and diamond-shaped components represent pass gates ("PG"). The pass gates are also referred to as transmission gates.

As used herein, an open or a closed state of a pass gate is analogous to a physical gate along a road. A closed pass gate blocks forward propagation, and an open pass gate enables forward propagation. In other words, a pass gate that is described as being in a closed state acts like a switch that has been opened to prevent signal propagation along an electrical pathway. In contrast, a pass gate that is described as being in an open state acts like a switch that has been closed to permit signal propagation along an electrical pathway.

In an example operation, the oval-shaped pass gate 1212 is in a closed state (e.g., acts like a switch that has been opened to prevent signal propagation) if the retention control signal 208 is a logical 1 or high. Thus, the oval-shaped pass gate 1212 is in an open state (e.g., acts like a switch that has been closed to permit signal propagation) if the retention control signal 208 is a logical 0 or low. The diamond-shaped pass gate 1214, on the other hand, is in a closed state if the retention control signal 208 is a logical 0 or low. Thus, the diamond-shaped pass gate 1214 is in an open state if the retention control signal 208 is a logical 1 or high. In an alternative implementation, the logical values or voltage levels may be swapped.

The master portion 1202 of the rising-edge-triggered retention flip-flop 902 includes an oval-shaped pass gate 1212 that is closed if the retention control signal 208 is high but that is open if the retention control signal 208 is low. In contrast, the live slave portion 1204 of the retention flip-flop 902 includes a diamond-shaped pass gate 1214 that is closed if the retention control signal 208 is low but that is open if the retention control signal 208 is high. This arrangement enables the pass gate 1212 of the non-live master portion 1202 to be opened and closed responsive to the same-valued signal as that for the pass gate 1214 of the live slave portion 1204 while being in an opposite state. The effective result of a given signal value, however, is reversed for the live portion as compared to the non-live portion.

In the regular operational mode 112, the control signal manager 210 forwards the controlled clock signal 108C as the retention control signal 208 to the rising-edge-triggered retention flip-flop 902 responsive to an inactive state 306 of the retention signal 110. Within the retention flip-flop 902, responsive to a rising edge of a pulse of the retention control signal 208, the diamond-shaped pass gate 1214 opens and permits data to propagate to the slave portion 1204 from the master portion 1202. Meanwhile, the oval-shaped pass gate 1212 is closed by the rising edge of the pulse. Responsive to a falling edge of a pulse of the retention control signal 208, the oval-shaped pass gate 1212 opens and permits data to propagate to the master portion 1202 of the positive-edge-triggered retention flip-flop 902 from another circuit device (not shown). The falling edge of the pulse of the retention control signal 208 causes the diamond-shaped pass gate 1214 to be closed, which isolates the data value located in the data storage (DS) unit of the slave portion 1204.

In contrast, in a retention operational mode 114 for a power collapse event 122, the control signal manager 210 clamps the retention control signal 208 to a constant value (e.g., an isolation value 1104) responsive to an active state 308 of the retention signal 110. In an example, the retention control signal 208 is clamped to logical 0 value, or low voltage level, if the retention operational mode 114 is engaged. The low voltage level of the retention control signal 208 closes the diamond-shaped pass gate 1214 of the live slave portion 1204. This closing of the diamond-shaped pass gate 1214 isolates the live slave portion 1204 from the collapsed master portion 1202 to protect a data value (e.g., a data value 116 of FIGS. 2 and 4) stored by the data storage (DS) unit of the slave portion 1204 during the power collapse event 122. After power is removed from the collapsible power rail 1208, the voltage level thereof drops, and the voltage level can drift toward ground in the master portion 1202. Meanwhile, stored data is safely retained in the live slave portion 1204 of the positive-edge-triggered retention flip-flop 902, which is coupled to the constant power rail 1206 and isolated from upstream circuitry by the diamond-shaped pass gate 1214.

The control signal managing circuitry of the control signal manager 210 can be implemented to include, for example, a logical NOR gate 1210 and an inverter 1216 as shown. The inverter 1216 receives at an input thereof the controlled clock signal 108C and produces at an output thereof an inverted version of the controlled clock signal 108C. The NOR gate 1210 receives at first and second inputs the retention signal 110 and the inverted version of the controlled clock signal 108C, respectively. The NOR gate 1210 produces at an output thereof the retention control signal 208. In accordance with a logical NOR operation, if the retention signal 110 is a logical 0 value (e.g., is in the inactive state 306), then the values of the controlled clock signal 108C are output as the retention control signal 208. This occurs because the inverter 1216 flips the oscillating values of the clock pulses of the controlled clock signal 108C at the second input of the NOR gate 1210 to account for the inverting operation implicitly included as part of the logical NOR operation. On the other hand, if the retention signal 110 is a logical 1 value (e.g., is in the active state 308), then the retention control signal 208 is clamped at a logical 0 value or low voltage level to achieve isolation of the data behind the diamond-shaped pass gate 1214.

FIG. 12 is described above in terms of a live slave portion 1204 retention flip-flop 902. With a live slave portion 1204 as illustrated in FIG. 12, isolation of the data is achieved with a logical 0 value on the retention control signal 208. Accordingly, the device-level schematic diagram 700 of FIG. 7 for the clock signal controller 402 in which data values are isolated for the data retention period using a logical low value is appropriate. However, the retention flip-flop 902 of FIG. 12 can alternatively be implemented with a live master portion 1202 in which isolation of the data is achieved with a logical 1 value on the retention control signal 208. In such live master implementations, the device-level schematic diagram 800 of FIG. 8 for the clock signal controller 402 in which data values are isolated for the data retention period using a logical high value is appropriate. In other words, for a live master portion 1202 as illustrated in FIG. 12, the retention control signal 208 is clamped at a logical 1 value or high voltage level to achieve isolation of the data behind the oval-shaped pass gate 1212.

Figure 13:
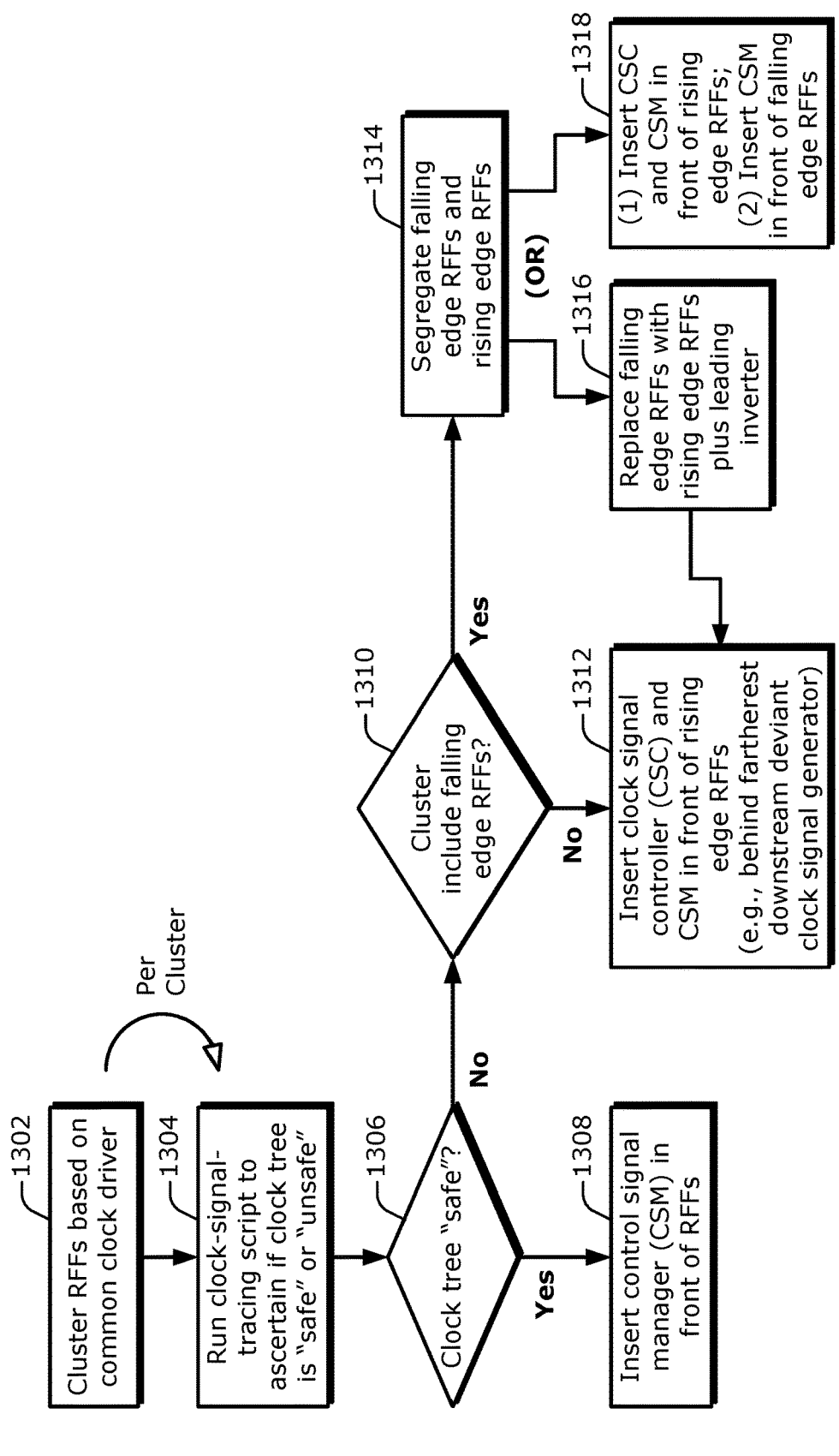
FIG. 13 is a flow diagram illustrating an example process for designing an integrated circuit that provides clock glitch prevention in conjunction with a memory for a retention operational mode.
Figure 14:
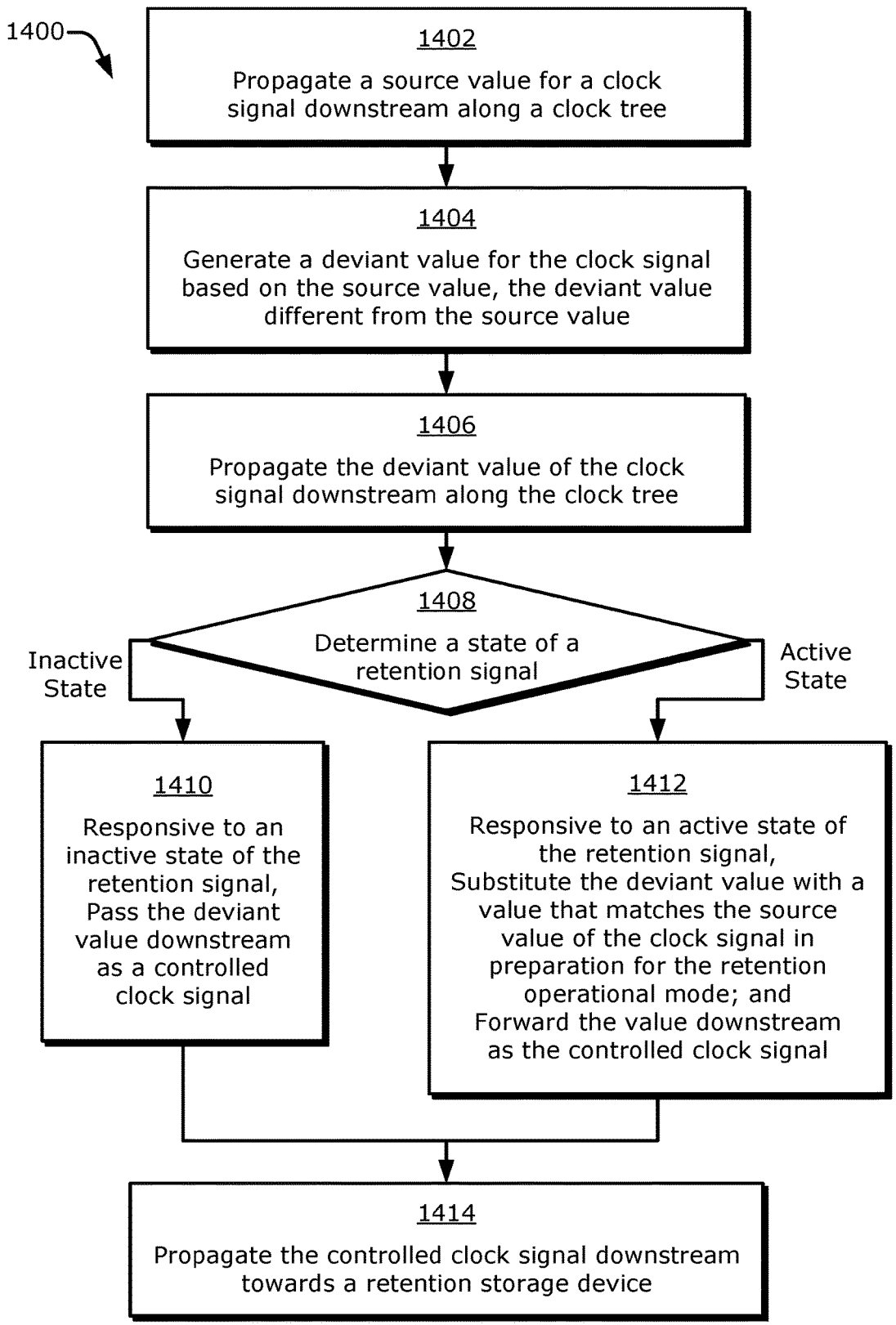
FIG. 14 is a flow diagram illustrating an example process for clock glitch prevention in conjunction with a memory for a retention operational mode.

FIGS. 13 and 14 depict flow diagrams directed to various aspects of clock glitch prevention for a retention operational mode. These flow diagrams are illustrated in the drawings and described herein using multiple blocks that indicate operations that may be performed. However, performance of the operations are not necessarily limited to the orders illustrated in FIGS. 13 and 14 or described herein, for the operations may be implemented in alternative orders or in fully or partially overlapping manners. FIG. 13 pertains to a method for designing an integrated circuit, and FIG. 14 pertains to a method performed by an integrated circuit.

FIG. 13 is a flow diagram illustrating an example process 1300 for designing an integrated circuit including clock glitch prevention in conjunction with a memory for a retention operational mode. The process 1300 is described in terms of a set blocks 1302-1318, with each block representative of at least one operation. For the flow diagram of FIG. 13, the retention storage devices are implemented as retention flip-flops 902. At block 1302, the retention flip-flops 902 are grouped into clusters based on common clock drivers. At block 1304, a clock-signal-tracing script is run for each cluster to ascertain if the clock tree 102 thereof is "safe" or "unsafe." A clock tree 102 is unsafe if the clock tree 102 includes a deviant clock signal generator 206 that creates a situation in which downstream circuit devices may not be provided the same low-voltage-level source value 404 output by a safe clock signal source 202 for a retention operational mode 114.

At block 1306, a branching operation is performed based on whether the clock tree 102 is determined to be safe. If the clock tree 102 is safe, then at block 1308 at least one control signal manager 210 is inserted along the clock path prior to the retention flip-flops 902. If the clock tree 102 is not safe, then at block 1310 a determination is made as to whether the current cluster includes any falling-edge-triggered retention flip-flops. If not, then at block 1312 a clock signal controller 402 and at least one control signal manager 210 are inserted in front of the rising-edge-triggered retention flip-flops 902. The clock signal controller 402 is inserted, for instance, behind the deviant clock signal generator 206 that is farthest downstream from the clock signal source 202, or the deviant clock signal generator 206 that is closest to the rising-edge-triggered retention flip-flops 902.

If, on the other hand, the cluster does include a falling-edge-triggered retention flip-flop (as determined at block 1310), then at block 1314 the falling-edge-triggered retention flip-flops are segregated from the rising-edge-triggered retention flip-flops. The segregated falling-edge-triggered retention flip-flops and the segregated rising-edge-triggered retention flip-flops can be handled in a number of different manners, two of which are explicitly described at blocks 1316 and 1318. In one alternative, at block 1316, the falling-edge-triggered retention flip-flops are respectively replaced with rising-edge-triggered retention flip-flops along with a leading inverter. After this replacement is accomplished, a clock signal controller 402 and at least one control signal manager 210 are inserted along the clock path in front of the original and the converted rising-edge-triggered retention flip-flops 902 in accordance with the operation(s) of block 1312. In another alternative, at block 1318, two actions are taken. First, a clock signal controller 402 and at least one control signal manager 210 are inserted in front of the segregated rising-edge-triggered retention flip-flops 902 as described for the operation(s) of block 1312. Second, a control signal manager 210 that is architected for falling edge circuitry is inserted in front of the segregated falling-edge-triggered retention flip-flops 902.

FIG. 14 is a flow diagram illustrating an example process 1400 for clock glitch prevention in conjunction with a memory for a retention operational mode. The process 1400 is described in terms of a set blocks 1402-1414, with each block representative of at least one operation. The operations may be performed by an integrated circuit, such as the integrated circuit 100 of FIG. 1 or the integrated circuit 1510 of FIG. 15, which is described below. More specifically, the operations of the process 1400 may be performed by a clock tree 102 or a memory 104 (e.g., of FIGS. 1 and 2).

At block 1402, a source value for a clock signal is propagated downstream along a clock tree. For example, an integrated circuit can propagate a source value 404 for a clock signal 108 downstream along a clock tree 102. For instance, clock tree logic 204 may propagate a source clock signal 108S in a downstream direction 118 away from a clock signal source 202.

At block 1404, a deviant value for the clock signal is generated based on the source value, with the deviant value being different from the source value. For example, the integrated circuit can generate a deviant value 406 for the clock signal 108 based on the source value 404, with the deviant value 406 differing from the source value 404. This generation may be performed by a deviant clock signal generator 206. The deviant clock signal generator 206 may invert the source value 404 or alter the source value 404 in a manner that produces an unpredictable deviant value 406.

At block 1406, the deviant value of the clock signal is propagated downstream along the clock tree. For example, the integrated circuit can propagate the deviant value 406 of the clock signal 108 downstream along the clock tree 102. The clock tree logic 204 may, for instance, propagate a deviant clock signal 108D in the downstream direction 118 away from the deviant clock signal generator 206 and towards a memory 104 having at least one retention storage device 212.

At block 1408, a state of a retention signal is determined. For example, the integrated circuit can determine a state—such as an inactive state 306 or an active state 308—of a retention signal 110. The determination of the state of the retention signal 110 may be accomplished with combinational logic using one or more logic gates, such as an AND gate or a NOR gate, with or without other circuit devices.

For an inactive state of the retention signal, at block 1410, the deviant value is passed downstream as a controlled clock signal. For example, responsive to the inactive state 306 of the retention signal 110, the integrated circuit can pass the deviant value 406 downstream as a controlled clock signal 108C. To do so, a clock signal controller 402 may pass the deviant clock signal 108D to downstream circuitry in an unchanged form if the retention signal 110 is not asserted.

For an active state of the retention signal, at block 1412, the deviant value is substituted with a value that matches the source value of the clock signal in preparation for the retention operational mode, and the value is forwarded downstream as the controlled clock signal. For example, responsive to the active state 308 of the retention signal 110, the integrated circuit can substitute the deviant value 406 with a value that matches the source value 404 of the clock signal 108 in preparation for the retention operational mode 114, and the integrated circuit can forward the substituted value downstream as the controlled clock signal 108C. To do so, the clock signal controller 402 can block further propagation of the incoming deviant clock signal 108D and drive the outgoing controlled clock signal 108C to a logical zero, or low voltage level, which matches the clock signal 108 as output by the clock signal source 202 in response to a clock-disable signal in preparation for a power collapse event 122.

At block 1414, the controlled clock signal is propagated downstream towards a retention storage device. For example, the integrated circuit can propagate the controlled clock signal 108C downstream towards a retention storage device 212. For instance, additional clock tree logic 204 or at least one signaling pathway may carry the controlled clock signal 108C toward at least one retention flip-flop 902, such as via a control signal manager 210.

Example implementations of the process 1400 can further include an operation of producing a retention control signal 208 based on the controlled clock signal 108C and responsive to the retention signal 110, as well as routing the retention control signal 208 to the retention storage device 212.

An example implementation of the producing the retention control signal 208 can include passing the controlled clock signal 108C as the retention control signal 208 responsive to the inactive state 306 of the retention signal 110 or driving the retention control signal 208 to an isolation value 1104 responsive to the active state 308 of the retention signal 110. Example implementations of the process 1400 can further include an operation of retaining a data value 116 in the retention storage device 212 responsive to the retention control signal 208 having the isolation value 1104 during a power collapse event 122.

An example implementation of the routing of the retention control signal 208 can include fanning out the retention control signal 208 to multiple retention storage devices 212, such as multiple retention flip-flops 902. Example implementations of the process 1400 can further include an action of operating the multiple retention storage devices 212 in a regular operational mode 112 and in the retention operational mode 114 using the retention control signal 208 as a combined clock and retention signal.

Figure 15:
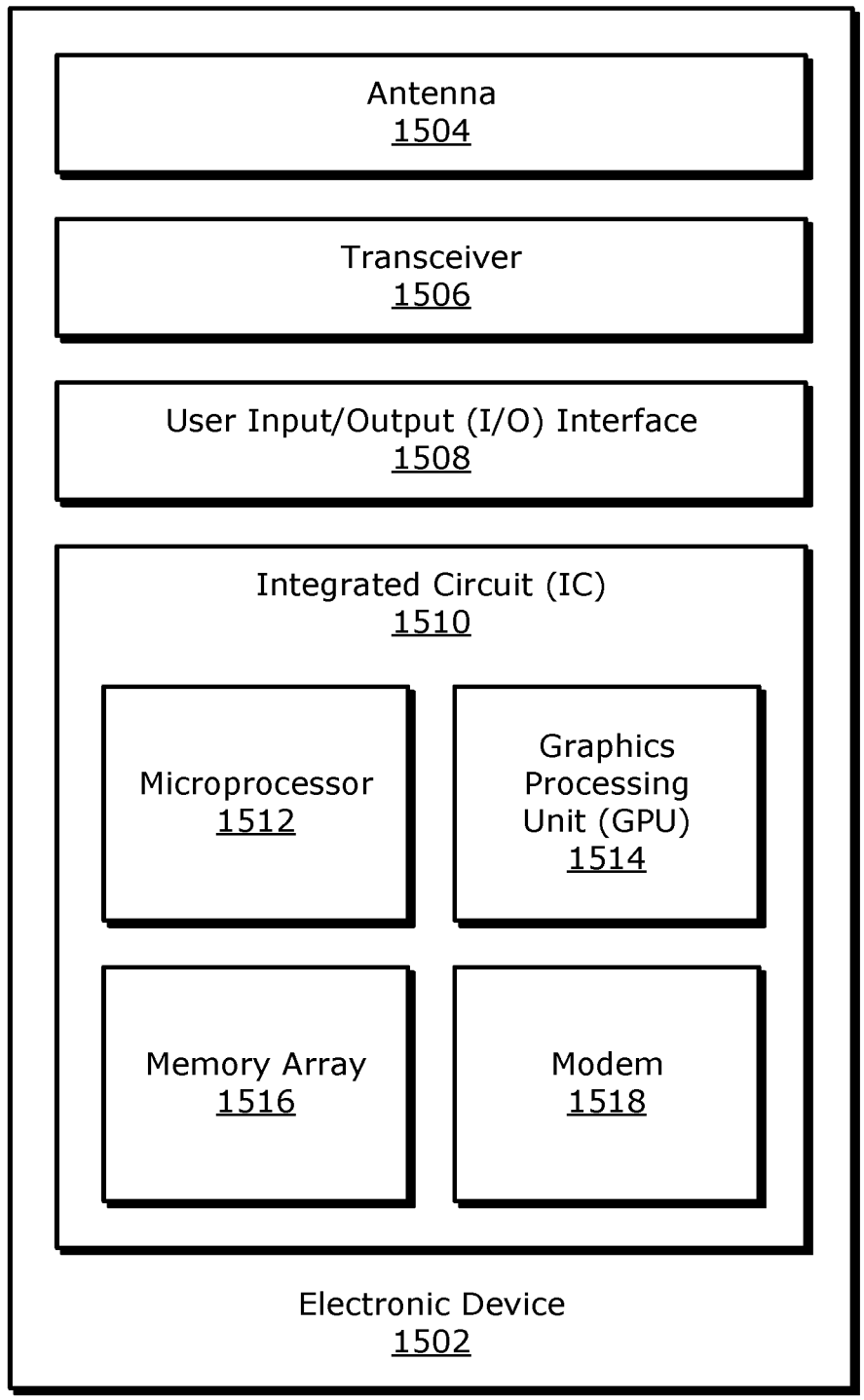
FIG. 15 depicts an example electronic device that includes an integrated circuit having multiple blocks or cores.

FIG. 15 depicts an example electronic device 1502 that includes an integrated circuit (IC) 1510 having multiple blocks or cores. As shown, the electronic device 1502 includes an antenna 1504, a transceiver 1506, and a user input/output (I/O) interface 1508 in addition to the integrated circuit 1510. Illustrated examples of the integrated circuit 1510, or cores thereof, include the microprocessor 1512, a graphics processing unit (GPU) 1514, a memory array 1516, and a modem 1518. In one or more implementations, power management techniques as described herein can be implemented by the integrated circuit 1510, e.g., by using retention storage devices 212 that are controlled by a clock signal controller 402 or a control signal manager 210.

The electronic device 1502 can be a mobile or battery-powered device or a fixed device that is designed to be powered by an electrical grid. Examples of the electronic device 1502 include a server computer, a network switch or router, a blade of a data center, a personal computer, a desktop computer, a notebook or laptop computer, a tablet computer, a smart phone, an entertainment appliance, or a wearable computing device such as a smartwatch, intelligent glasses, or an article of clothing. An electronic device 1502 can also be a device, or a portion thereof, having embedded electronics. Examples of the electronic device 1502 with embedded electronics include a passenger vehicle, industrial equipment, a refrigerator or other home appliance, a drone or other unmanned aerial vehicle (UAV), a power tool, or an Internet of Things (IoT) device.

For an electronic device with a wireless capability, the electronic device 1502 includes an antenna 1504 that is coupled to a transceiver 1506 to enable reception or transmission of one or more wireless signals. The integrated circuit 1510 may be coupled to the transceiver 1506 to enable the integrated circuit 1510 to have access to received wireless signals or to provide wireless signals for transmission via the antenna 1504. The electronic device 1502 as shown also includes at least one user I/O interface 1508. Examples of the user I/O interface 1508 include a keyboard, a mouse, a microphone, a touch-sensitive screen, a camera, an accelerometer, a haptic mechanism, a speaker, a display screen, or a projector.

The integrated circuit 1510 may include, for example, one or more instances of a microprocessor 1512, a GPU 1514, a memory array 1516, a modem 1518, and so forth. The microprocessor 1512 may function as a central processing unit (CPU) or other general-purpose processor. Some microprocessors include different parts, such as multiple processing cores, that may be individually powered on or off. The GPU 1514 may be especially adapted to process visual-related data for display. If visual-related data is not being rendered or otherwise processed, the GPU 1514 may be fully or partially powered down. The memory array 1516 stores data for the microprocessor 1512 or the GPU 1514. Example types of memory for the memory array 1516 include random access memory (RAM), such as dynamic RAM (DRAM) or static RAM (SRAM); flash memory; and so forth. If programs are not accessing data stored in memory, the memory array 1516 may be powered down overall or by individual areas. The modem 1518 demodulates a signal to extract encoded information or modulates a signal to encode information into the signal. If there is no information to decode from an inbound communication or to encode for an outbound communication, the modem 1518 may be idled to reduce power consumption. The integrated circuit 1510 may include additional or alternative parts than those that are shown, such as an I/O interface, a sensor such as an accelerometer, a transceiver or another part of a receiver chain, a customized or hard-coded processor such as an application-specific integrated circuit (ASIC), and so forth.

The integrated circuit 1510 may also comprise a system on a chip (SOC). An SOC may integrate a sufficient number of different types of components to enable the SOC to provide computational functionality as a notebook computer, a mobile phone, or another electronic apparatus using one chip, at least primarily. Components of an SOC, like that of an integrated circuit 1510 generally, may be termed cores or blocks of circuitry. A core or block of an SOC may be powered down if not in use, such as by undergoing a power collapse or being multiplexed onto a power rail having a lower voltage level. Examples of cores or blocks include, in addition to those that are illustrated in FIG. 15, a voltage regulator, a main memory or cache memory block, a memory controller, a general-purpose processor, a cryptographic processor, a video or image processor, a vector processor, a radio, an interface or communications subsystem, a wireless controller, or a display controller. Any of these cores or blocks, such as a processing or GPU core, may further include multiple internal cores or blocks that can be individually powered.

Unless context dictates otherwise, use herein of the word "or" may be considered use of an "inclusive or," or a term that permits inclusion or application of one or more items that are linked by the word "or" (e.g., a phrase "A or B" may be interpreted as permitting just "A," as permitting just "B," or as permitting both "A" and "B"). Further, items represented in the accompanying figures and terms discussed herein may be indicative of one or more items or terms, and thus reference may be made interchangeably to single or plural forms of the items and terms in this written description. Finally, although subject matter has been described in language specific to structural features or methodological operations, it is to be understood that the subject matter defined in the appended claims is not necessarily limited to the specific features or operations described above, including not necessarily being limited to the organizations in which features are arranged or the orders in which operations are performed.

What is claimed is:

1. An apparatus comprising:
    a clock signal source configured to generate a source value for a clock signal;
    a clock tree configured to distribute the clock signal from the clock signal source along a downstream direction;
    a deviant clock signal generator disposed along the clock tree downstream from the clock signal source, the deviant clock signal generator configured to generate a deviant value for the clock signal, the deviant value different from the source value;
    a clock signal controller disposed downstream from the deviant clock signal generator, the clock signal controller configured to prevent downstream propagation of the deviant value by producing a controlled value for the clock signal responsive to a retention signal;
    a control signal manager disposed downstream from the clock signal controller, the control signal manager configured to receive the controlled value for the clock signal via the clock signal controller and to produce a retention control signal based on the controlled value of the clock signal and responsive to the retention signal; and
    a retention storage device disposed downstream from the control signal manager, the retention storage device configured to process data responsive to the retention control signal and to retain a data value during a power collapse event responsive to the retention control signal.

2. The apparatus of claim 1, wherein the clock signal source is configured to drive the source value of the clock signal to a constant voltage level for a retention operational mode to prepare for the power collapse event.

3. The apparatus of claim 2, wherein the constant voltage level comprises a low voltage level in a binary digital system.

4. The apparatus of claim 2, wherein the clock signal source comprises clock gating circuitry configured to halt oscillation of the source value of the clock signal.

5. The apparatus of claim 1, wherein the deviant clock signal generator comprises at least one circuit device, the at least one circuit device configured to cause the deviant value of the clock signal to have an opposite voltage level in comparison to that of the source value of the clock signal.

6. The apparatus of claim 5, wherein the at least one circuit device comprises at least one of:
    an exclusive-or (XOR) gate;
    a register; or
    one or more inverters in series having an odd total number of inverters.

7. The apparatus of claim 1, wherein the clock signal controller is configured to:
    produce the controlled value of the clock signal responsive to the retention signal, with the controlled value having a constant voltage level that matches that of the source value of the clock signal in preparation for the power collapse event; and
    propagate the controlled value of the clock signal further downstream toward the control signal manager.

8. The apparatus of claim 7, wherein:
    the constant voltage level comprises a low voltage level in a binary digital system; and
    the clock signal controller is configured to drive the controlled value of the clock signal to the low voltage level to enable a retention operational mode for the power collapse event.

9. The apparatus of claim 1, wherein:
    the retention storage device comprises a retention flip-flop including a master portion and a slave portion; and
    the retention flip-flop is configured to:
        advance data values through the master portion and the slave portion during a regular operational mode responsive to the retention control signal; and
        retain the data value during a retention operational mode for the power collapse event responsive to the retention control signal.

10. The apparatus of claim 1, further comprising:
    at least one antenna;
    at least one display screen; and
    at least one integrated circuit coupled between the at least one antenna and the at least one display screen; the at least one integrated circuit including the clock tree, the deviant clock signal generator, the clock signal controller, the control signal manager, and the retention storage device,
    wherein the at least one integrated circuit is configured to present graphics on the at least one display screen using the retention storage device as operated responsive to the retention control signal based on a wireless signal received via the at least one antenna.

11. The apparatus of claim 1, further comprising:
    multiple retention storage devices configured to:
        receive the retention control signal from the control signal manager; and
        operate memory functions based on the retention control signal.

12. The apparatus of claim 11, further comprising routing circuitry configured to route the retention control signal from the control signal manager to each of the multiple retention storage devices, wherein the control signal manager is disposed external to the multiple retention storage devices.

13. The apparatus of claim 11, further comprising multiple control signal managers, wherein:
    each respective control signal manager of the multiple control signal managers is disposed internal to each respective retention storage device of the multiple retention storage devices, and
    each respective control signal manager is configured to:
        produce a respective retention control signal based on the controlled value of the clock signal received via the clock signal controller and responsive to the retention signal; and provide the respective retention control signal to the respective retention storage device.

14. The apparatus of claim 1, wherein the control signal manager is configured to:
pass the controlled value of the clock signal as received via the clock signal controller as the retention control signal responsive to an inactive state of the retention signal; and
drive the retention control signal to an isolation value responsive to an active state of the retention signal.

15. The apparatus of claim 14, wherein:
the isolation value comprises a low voltage level in a binary digital system; and
the retention storage device is configured to isolate the data value responsive to the low voltage level to enable the data value to survive the power collapse event of a retention operational mode.

16. An apparatus comprising:
a clock signal source configured to generate a source value for a clock signal;
a clock tree configured to distribute the clock signal from the clock signal source along a downstream direction in which the clock signal propagates away from the clock signal source;
deviation means for generating a deviant value for the clock signal, the deviant value different from the source value, the deviation means disposed along the clock tree downstream from the clock signal source;
clock control means for producing a controlled value for the clock signal to prevent downstream propagation of the deviant value of the clock signal responsive to a retention signal, the clock control means disposed downstream from the deviation means;
retention control means for producing a retention control signal based on the controlled value of the clock signal and responsive to the retention signal, wherein the retention control means is disposed downstream from the clock control means; and
a retention storage device disposed downstream from the retention control means, the retention storage device configured to process data responsive to the retention control signal and to retain a data value during a power collapse event responsive to the retention control signal.

17. The apparatus of claim 16, wherein the clock control means comprises:
means for passing the deviant value of the clock signal downstream as the controlled value of the clock signal responsive to an inactive state of the retention signal; and
means for forwarding a value, which matches the source value of the clock signal in preparation for a retention operational mode, downstream as the controlled value of the clock signal responsive to an active state of the retention signal.

18. The apparatus of claim 16, wherein an active state of the retention signal is indicative of an occurrence of the power collapse event.

19. The apparatus of claim 16, wherein the retention control means is configured to:
pass the controlled value of the clock signal received via the clock control means as the retention control signal responsive to an inactive state of the retention signal; and
drive the retention control signal to an isolation value responsive to an active state of the retention signal.

20. The apparatus of claim 19, wherein:
the retention storage device is configured to receive the retention control signal from the retention control means; and
the retention storage device is configured to isolate the data value responsive to the retention control signal having the isolation value to enable the data value to survive the power collapse event for a retention operational mode.

21. A method for preventing clock glitches for a retention operational mode, the method comprising:
propagating a source value of a clock signal downstream along a clock tree;
generating a deviant value for the clock signal based on the source value, the deviant value different from the source value;
propagating the deviant value of the clock signal downstream along the clock tree;
determining a state of a retention signal;
responsive to an inactive state of the retention signal, passing the deviant value downstream as a controlled value for the clock signal;
responsive to an active state of the retention signal,
substituting the deviant value with a value that matches the source value of the clock signal in preparation for the retention operational mode; and
forwarding the value downstream as the controlled value for the clock signal;
propagating the controlled value of the clock signal downstream, with the controlled value determined responsive to the state of the retention signal;
producing a retention control signal based on the controlled value of the clock signal and responsive to the state of the retention signal; and
presenting the retention control signal to a retention storage device.

22. The method of claim 21, wherein the propagating of the deviant value of the clock signal downstream along the clock tree comprises:
oscillating the deviant value of the clock signal downstream based on oscillations of the source value of the clock signal.

23. The method of claim 21, wherein the producing the retention control signal comprises:
responsive to the inactive state of the retention signal, passing the controlled value of the clock signal as the retention control signal; and
responsive to the active state of the retention signal, driving the retention control signal to an isolation value.

24. The method of claim 23, further comprising:
retaining a data value in the retention storage device responsive to the retention control signal having the isolation value during a power collapse event of the retention operational mode, the active state of the retention signal indicative of the retention operational mode.

25. The method of claim 21, wherein:
the presenting comprises fanning out the retention control signal to multiple retention storage devices; and
the method further comprises operating the multiple retention storage devices in a regular operational mode and in the retention operational mode using the retention control signal as a combined clock and retention signal.

26. An integrated circuit comprising:
clock signal controlling circuitry configured to receive a clock signal and a retention signal and to output a controlled clock signal, the clock signal controlling circuitry configured to:
  responsive to the retention signal having an inactive state, output the clock signal as the controlled clock signal; and
  responsive to the retention signal having an active state, swallow the clock signal and output a retention-capable value as the controlled clock signal;
control signal managing circuitry coupled to the clock signal controlling circuitry and configured to receive the controlled clock signal and to output a retention control signal; the control signal managing circuitry comprising a NOR gate having a first input coupled to the controlled clock signal, a second input coupled to the retention signal, and an output corresponding to the retention control signal; the control signal managing circuitry configured to:
  responsive to the retention signal having the inactive state, output the controlled clock signal as the retention control signal; and
  responsive to the retention signal having the active state, clamp the controlled clock signal and output an isolation value as the retention control signal; and
a retention flip-flop coupled to the control signal managing circuitry and configured to receive the retention control signal, the retention flip-flop configured to isolate a data value stored in the retention flip-flop to retain the data value during a power collapse event responsive to the retention control signal having the isolation value.

27. The integrated circuit of claim 26, wherein the clock signal controlling circuitry comprises a latch, the latch configured to cause the clock signal controlling circuitry to output the retention-capable value as the controlled clock signal responsive to the retention signal having the active state.

28. The integrated circuit of claim 27, wherein:
the retention-capable value comprises a logical zero; and
the latch is configured to cause the clock signal controlling circuitry to continue to output the logical zero as the controlled clock signal until the retention signal has the inactive state and the clock signal transitions from a logical zero to a logical one.

29. The integrated circuit of claim 26, further comprising:
deviant clock signal generating circuitry disposed along a clock tree and configured to:
  receive a source value from a clock signal source;
  generate a deviant value from the source value, the deviant value configured to oscillate responsive to oscillations in the source value, the deviant value different from the source value; and
  provide downstream on the clock tree the deviant value as the clock signal for the clock signal controlling circuitry.

30. The integrated circuit of claim 26, wherein the retention flip-flop comprises a live-slave retention flip-flop having a slave portion, the live-slave retention flip-flop configured to advance a data value into the slave portion responsive to a rising edge of the retention control signal.

* * * * *